(12) United States Patent
Lee et al.

(10) Patent No.: US 12,512,856 B2
(45) Date of Patent: Dec. 30, 2025

(54) STORAGE DEVICES CONFIGURED TO GENERATE PARITY BASED ON RELIABILITY, AND METHODS OF OPERATION OF THE SAME

(71) Applicant: Samsung Electronics Co., Ltd., Suwon-si (KR)

(72) Inventors: Kangseok Lee, Suwon-si (KR); Gibeom Park, Suwon-si (KR); Seona Won, Suwon-si (KR); Sung-Hwan Bae, Suwon-si (KR); Dong-Min Shin, Suwon-si (KR); Jinwoo Hong, Suwon-si (KR); Youngjun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/763,252

(22) Filed: Jul. 3, 2024

(65) Prior Publication Data
US 2025/0192805 A1    Jun. 12, 2025

(30) Foreign Application Priority Data

Dec. 7, 2023 (KR) ........................ 10-2023-0176676

(51) Int. Cl.
*H03M 13/35* (2006.01)
(52) U.S. Cl.
CPC .................................. *H03M 13/35* (2013.01)
(58) Field of Classification Search
CPC ..................................................... H03M 13/35
See application file for complete search history.

(56) References Cited

U.S. PATENT DOCUMENTS

| | | | |
|---|---|---|---|
| 6,311,304 B1 * | 10/2001 | Kwon | ................... H03M 13/29 714/701 |
| 7,739,576 B2 | 6/2010 | Radke | |
| 8,898,548 B1 | 11/2014 | Mullendore et al. | |
| 9,201,728 B2 | 12/2015 | Patapoutian et al. | |
| 9,940,194 B2 | 4/2018 | Achtenberg et al. | |
| 10,847,246 B2 | 11/2020 | Shin et al. | |
| 11,527,300 B2 | 12/2022 | Yang et al. | |
| 11,726,665 B1 | 8/2023 | Sabbag et al. | |
| 11,755,406 B2 | 9/2023 | Mondello et al. | |

(Continued)

FOREIGN PATENT DOCUMENTS

KR        102511903 B1    3/2023

*Primary Examiner* — Joseph D Torres
(74) *Attorney, Agent, or Firm* — Wolf, Greenfield & Sacks, P.C.

(57) ABSTRACT

An operating method of a storage device, the storage device including a page type table, a parity table, and a non-volatile memory device, and the method including receiving a write request of first data from a host device, generating a first inside parity and a first outside parity, based on the first data, storing the first outside parity in the parity table, obtaining first reliability type information of a first page for storing the first data, by referring to the page type table, generating a first flexible parity, based on the first inside parity and the first reliability type information, generating first encoding data, based on the first data and the first flexible parity, and storing the first encoding data in the non-volatile memory device.

20 Claims, 15 Drawing Sheets

(56) References Cited

U.S. PATENT DOCUMENTS

| | | | |
|---|---|---|---|
| 2014/0068397 A1* | 3/2014 | Feldman | H03M 13/2909 |
| | | | 714/E11.032 |
| 2022/0188188 A1 | 6/2022 | Twitto | |
| 2023/0207017 A1 | 6/2023 | Oh et al. | |

* cited by examiner

FIG. 7

| Sector Data | | dp | is | os |
|---|---|---|---|---|
| 0 | 0 | dpp1 | 0 | 0 |
| 0 | 1 | dpp2 | 0 | 0 |
| 1 | 0 | dpp3 | 0 | 0 |
| 1 | 1 | dpp4 | 0 | 0 |
| 0 | 0 | 0 | isp1 | 0 |
| 0 | 1 | 0 | isp2 | 0 |
| 1 | 0 | 0 | isp3 | 0 |
| 1 | 1 | 0 | isp4 | 0 |
| 0 | 0 | 0 | 0 | osp1 |
| 0 | 1 | 0 | 0 | osp2 |
| 1 | 0 | 0 | 0 | osp3 |
| 1 | 1 | 0 | 0 | osp4 |

1st Hamming Matrix (general)
2nd Hamming Matrix (inside sub parity)
3rd Hamming Matrix (outside sub parity)
Integrate Hamming Matrix

STORAGE DEVICES CONFIGURED TO GENERATE PARITY BASED ON RELIABILITY, AND METHODS OF OPERATION OF THE SAME

CROSS-REFERENCE TO RELATED APPLICATION

This application claims priority under 35 U.S.C. § 119 to Korean Patent Application No. 10-2023-0176676 filed on Dec. 7, 2023, in the Korean Intellectual Property Office, and the entire contents of the above-identified application are incorporated by reference herein.

BACKGROUND

Aspects of the present disclosure relate to storage devices, and more particularly, relate to storage devices configured to generate a parity based on reliability. Aspects of the present disclosure also relate to operating methods of such storage devices.

A storage device may be a device, which is configured to store data under control of a host device, such as a computer, a smartphone, or a smart pad. The storage device may include a device, which stores data on a magnetic disk, such as a hard disk drive (HDD), or may include a device, which stores data in a semiconductor memory, e.g., a nonvolatile memory, such as a solid state drive (SSD) or a memory card.

Examples of nonvolatile memories includes read only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (RRAM), and ferroelectric RAM (FRAM), but nonvolatile memories are not limited thereto.

An error may occur in the process of storing data in the storage device, while the storage device stores data, and/or in the process of reading data from the storage device. To correct such errors, the storage device may store a parity that may be used in error detection and correction together with data. However, an error may occur in the process of storing the parity.

SUMMARY

Some aspects of the present disclosure provide storage devices configured to generate a parity based on reliability and operating methods thereof.

According to some embodiments, an operating method of a storage device which includes a page type table, a parity table, and a non-volatile memory device may include receiving a write request of first data from a host device, generating a first inside parity and a first outside parity based on the first data, storing the first outside parity in the parity table, obtaining first reliability type information of a first page for storing the first data, by referring to the page type table, generating a first flexible parity, based on the first inside parity and the first reliability type information, generating first encoding data, based on the first data and the first flexible parity, and storing the first encoding data in the non-volatile memory device.

According to some embodiments, a storage device may include a non-volatile memory device that includes a plurality of pages, a command manager that receives a write request of first data from a host device and determines a first page for storing the first data from among the plurality of pages, a page type table that stores a plurality of reliability type information respectively corresponding to the plurality of pages, a parity table, and an ECC engine. The ECC engine may generate a first inside parity and a first outside parity, based on the first data, may store the first outside parity in the parity table, may obtain first reliability type information of the first page, by referring to the page type table, may generate a first flexible parity, based on the first inside parity and the first reliability type information, may generate first encoding data, based on the first data and the first flexible parity, and may store the first encoding data in the non-volatile memory device.

According to some embodiments, an operating method of a storage device which includes a memory block type table, a parity table, and a non-volatile memory device may include receiving a write request of first data from a host device, generating a first inside parity and a first outside parity, based on the first data, storing the first outside parity in the parity table, obtaining first reliability type information of a first memory block for storing the first data, by referring to the memory block type table, generating a first flexible parity, based on the first inside parity and the first reliability type information, generating first encoding data, based on the first data and the first flexible parity, and storing the first encoding data in the non-volatile memory device.

BRIEF DESCRIPTION OF THE FIGURES

The above and other objects and features of the present disclosure will become apparent by describing in detail some examples of embodiments of the inventive concepts with reference to the accompanying drawings.

FIG. 7 describes Hamming matrixes according to some embodiments of the present disclosure.

DETAILED DESCRIPTION

Below, some examples of embodiments of the present disclosure will be described in detail and with sufficient clarity to permit one skilled in the art to carry out implementation of the inventive concepts of the present disclosure.

Figure 1:
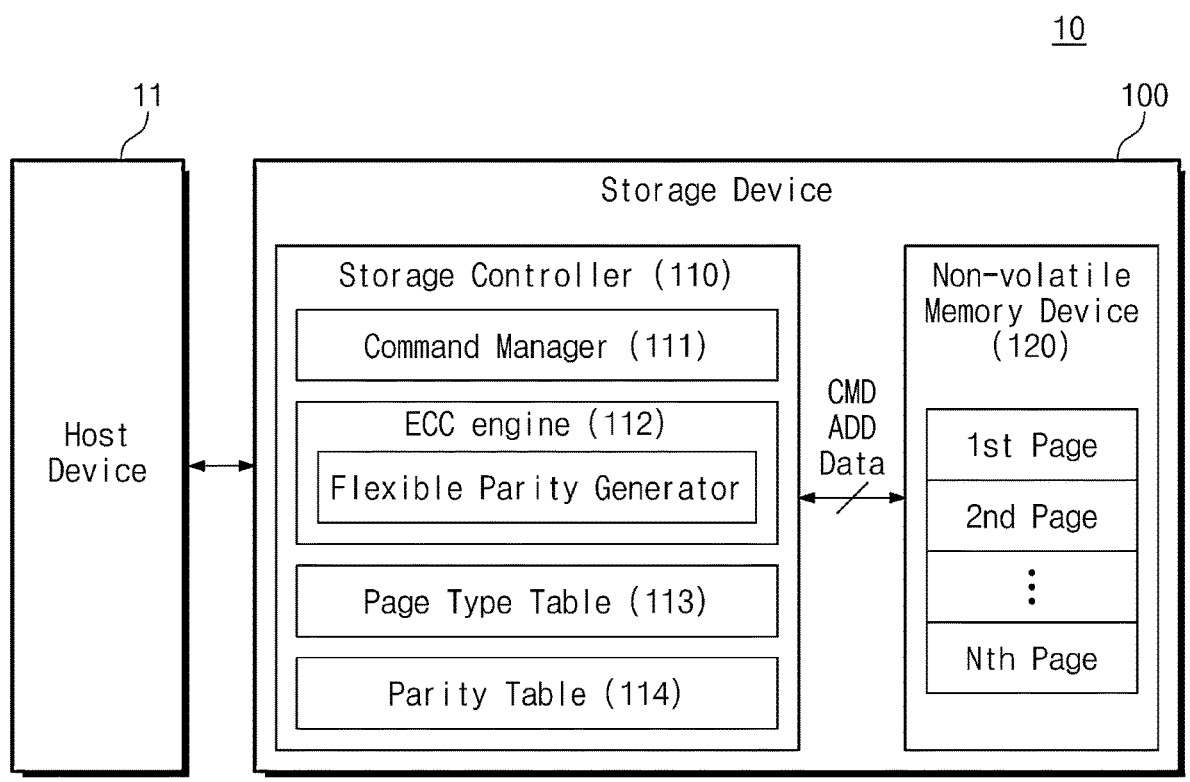
FIG. 1 is a block diagram of a storage system according to an embodiment of the present disclosure.

FIG. 1 is a block diagram of a storage system according to some embodiments of the present disclosure. Referring to FIG. 1, a storage system 10 may include a host device 11 and a storage device 100. In some embodiments, the storage system 10 may refer to a computing system, which may be configured to process a variety of information, such as a personal computer (PC), a notebook, a laptop, a server, a workstation, a tablet PC, a smartphone, a digital camera, or a black box.

The host device 11 may control an overall operation of the storage system 10. For example, the host device 11 may store data in the storage device 100 and/or may read data stored in the storage device 100.

The storage device 100 may include a storage controller 110 and a non-volatile memory device 120. The non-volatile memory device 120 may store data. The storage controller 110 may store data in the non-volatile memory device 120 and/or may read data stored in the non-volatile memory device 120. The non-volatile memory device 120 may operate under control of the storage controller 110. For example, based on a command CMD that indicates an operation and an address ADD that indicates a location of data, the storage controller 110 may store data in the non-volatile memory device 120 and/or may read data stored in the non-volatile memory device 120.

The non-volatile memory device 120 may include a plurality of pages. For example, the non-volatile memory device 120 may include first to N-th pages. Herein, "N" may be an arbitrary natural number. Each of the first to N-th pages may include a plurality of memory cells. The plurality of memory cells may store data. An example of a page will be described in greater detail with reference to FIG. 3.

In some embodiments, the non-volatile memory device 120 may be a NAND flash memory device, but the present disclosure is not limited thereto. For example, the non-volatile memory device 120 may be one of various storage devices, which retain data stored therein even when a power is turned off, such as a phase-change random access memory (PRAM), a magnetic random access memory (MRAM), a resistive random access memory (RRAM), or a ferroelectric random access memory (FRAM).

The storage controller 110 may include a command manager 111, an error correction code (ECC) engine 112, a page type table 113, and a parity table 114.

The command manager 111 may manage various commands that indicate operations to be performed in the non-volatile memory device 120. For example, the command manager 111 may provide the non-volatile memory device 120 with various commands such as a read command, a write command, and/or an erase command.

The command manager 111 may provide the non-volatile memory device 120 with the write command including encoding data. The encoding data may indicate write data encoded by the ECC engine 112. For example, the write data may be received from the host device 11.

In some embodiments, the command manager 111 may manage a command that indicates a distribution read operation for generating distribution data of each page of the non-volatile memory device 120. However, the present disclosure is not limited thereto. For example, the distribution data may be managed in units of memory chip, memory block, or word line. For example, through the distribution read operation, the non-volatile memory device 120 may provide the distribution data of each of a plurality of memory blocks to the storage controller 110. The memory block or the word line will be described in greater detail with reference to FIGS. 3 and 4.

The distribution data may indicate a threshold voltage distribution. That is, the distribution data may indicate the number of memory cells each having a threshold voltage level. The distribution data will be described in greater detail with reference to FIG. 9.

In some embodiments, for example, the command manager 111 may periodically provide a command that indicates the distribution read operation to the non-volatile memory device 120.

The ECC engine 112 may encode the write data and may provide the encoded data to the non-volatile memory device 120. The ECC engine 112 may decode read data obtained from the non-volatile memory device 120 and may detect and correct an error therein.

For encoding, the ECC engine 112 may first receive the write data. The ECC engine 112 may generate a parity for the write data by using an error correction code (ECC) technique. The parity may be an error correction code which may be used to detect and correct an error when the write data are read from the non-volatile memory device 120. The parity may include at least one bit.

In some embodiments, the ECC technique may indicate to use a Hamming matrix. For example, the ECC engine 112 may generate the parity by applying the Hamming matrix to the write data. The Hamming matrix will be described in greater detail with reference to FIG. 7.

The parity may indicate at least one of a default parity, a flexible parity, an inside parity, and an outside parity.

The default parity may be a parity which a general ECC engine may generate by applying a general ECC technique to write data.

The flexible parity may indicate a parity which may be generated based on write data and reliability of a page where the write data are to be stored. A flexible parity generator may generate the flexible parity based on the inside parity and outside parity of the write data, depending on a combination operation that is determined based on the reliability of a page where the write data are to be stored.

The inside parity may indicate a parity which may be used to generate the flexible parity of relevant write data.

The outside parity may indicate a parity which may be used to generate the flexible parity of write data different from the relevant write data.

For example, a first inside parity of first write data may be used to generate a first flexible parity of the first write data. A second inside parity of the first write data may be used to generate a second flexible parity of second write data.

The inside parity and the outside parity will be described in greater detail with reference to FIG. 6.

Returning to the flexible parity generator, when the reliability of a first page where the first write data are to be stored is relatively low, the flexible parity generator may generate the flexible parity by using only the first inside parity generated based on the first write data.

In contrast, when the reliability of the first page where the first write data are to be stored is relatively high, the flexible parity generator may generate the flexible parity by using 1) the first inside parity generated based on the first write data and 2) a second outside parity generated based on the second write data stored at a second page whose reliability is lower than that of the first page.

The plurality of pages of the non-volatile memory device 120 may be different in reliability. Due to physical differences in the design of the non-volatile memory device 120 or due to the number of times of a program operation for each page, the plurality of pages of the non-volatile memory device 120 may be different in reliability. In the plurality of pages, the probability that an error occurs at a page whose reliability is low may be higher than the probability that an error occurs at a page whose reliability is high. In this case, the probability that an error occurs at the parity stored at the page with the low reliability may be also high.

According to the present disclosure, the outside parity of the data which are stored at the page with the low reliability may be included or compressed in the flexible parity of the page with the high reliability; in this case, later, when an error occurs at the page with the low reliability, the error may be detected and corrected based on the flexible parity of the page with the high reliability. That is, the reliability of the storage device 100 may be improved.

The ECC engine 112 may generate the encoding data based on the write data and the parity. The encoding data may include a plurality of bits constituting the write data and the parity. The encoding data may be also referred to as a "codeword." The ECC engine 112 may provide the encoding data to the non-volatile memory device 120.

The page type table 113 may include information about a plurality of pages and a plurality of reliability type information respectively corresponding to the plurality of pages. Each of the plurality of reliability type information may indicate a reliable level of the corresponding page. The reliable level may indicate a given range of reliability.

For example, the first reliability type information may indicate a first reliable level. The second reliability type information may indicate a second reliable level that is higher than the first reliable level. The third reliability type information may indicate a third reliable level that is higher than the second reliable level (and thus also higher than the first reliable level). In this case, the first reliability type information may have a first reliability value corresponding to a "bad" state. The second reliability type information may have a second reliability value corresponding to a "normal" state. The third reliability type information may have a third reliability value corresponding to a "good" state.

Below, a page with the first reliability type information may be referred to as a "bad page." A page with the second reliability type information may be referred to as a "normal page." A page with the third reliability type information may be referred to as a "good page." It is understood that "bad," "normal," and "good" are relative indicators and may not indicate absolute states or statuses of pages.

The present disclosure is not limited to three reliability type informations. For example, the number of reliability type information may be less or more than 3. That is, reliable levels, the number of which is less or more than 3, may be distinguished from each other.

In some embodiments, the page type table 113 may be determined in advance. For example, the storage device 100 may evaluate the reliability of each page of the non-volatile memory device 120 during a process of testing the performance of the storage device 100. For example, the storage device 100 may test performance before receiving the write data. The storage device 100 may create the page type table 113 based on the reliability evaluated for each page.

In some embodiments, the page type table 113 may be updated. For example, based on the command indicating the distribution read operation, the non-volatile memory device 120 may provide the distribution data of each page to the storage controller 110. The storage controller 110 may determine the reliability type information of each page based on the distribution data. The storage controller 110 may update the page type table 113 based on the determined reliability type information. This will be described in greater detail with reference to FIG. 15.

The ECC engine 112 may obtain the reliability type information of a page where the write data are to be stored, by referring to the page type table 113.

The parity table 114 may store the outside parity and mapping information of the outside parity. The parity table 114 may receive the outside parity from the ECC engine 112. The mapping information may indicate information about a page where the flexible parity generated by using a relevant outside parity is stored.

For example, when a first outside parity generated from first write data is used to generate a second flexible parity stored at a second page, the parity table 114 may map the first outside parity to the second page and may store a mapping result as mapping information.

In some embodiments, the parity table 114 may be updated by the ECC engine 112. For example, when the parity table 114 receives the outside parity from the ECC engine 112, the outside parity may be added to the parity table 114. As another example, based on receiving information indicating that the flexible parity is used by using the outside parity from the ECC engine 112, the parity table 114 may add mapping information by mapping the outside parity to information of page where the flexible parity is stored.

In some embodiments, the ECC engine 112 may decode data read from a page with low reliability, by referring to the parity table 114. This will be described in greater detail with reference to FIG. 4.

Figure 2:
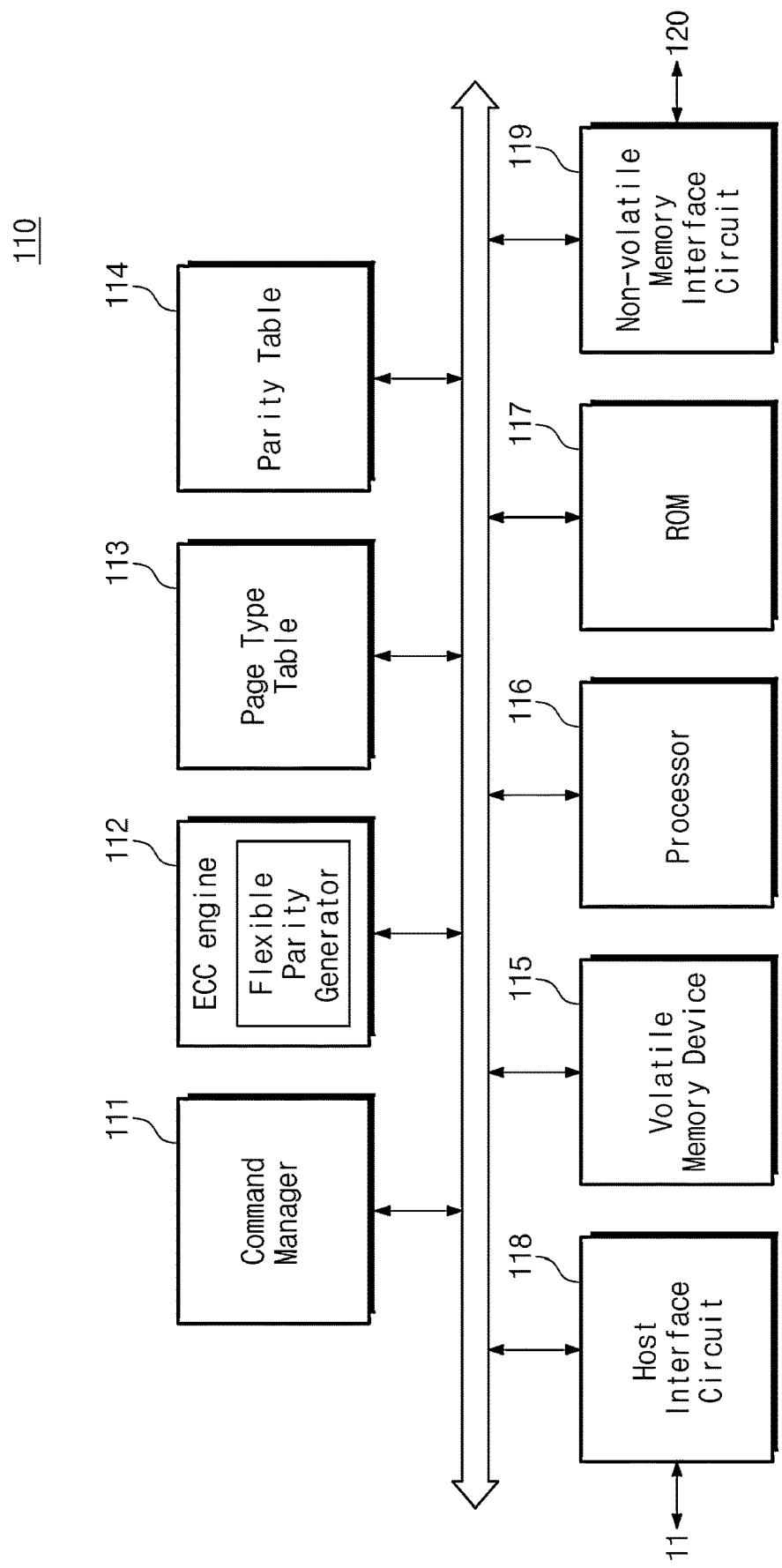
FIG. 2 is a block diagram illustrating a storage controller of FIG. 1 in detail, according to some embodiments of the present disclosure.

FIG. 2 is a block diagram illustrating a storage controller of FIG. 1 in greater detail, according to some embodiments of the present disclosure. Referring to FIGS. 1 and 2, the storage controller 110 may communicate with the host device 11 and the non-volatile memory devices 120. The storage controller 110 may include the command manager 111, the ECC engine 112, the page type table 113, the parity table 114, a volatile memory device 115, a processor 116, a read only memory (ROM) 117, a host interface circuit 118, and a non-volatile memory interface circuit 119.

The command manager 111 may manage commands that indicate operations to be performed in the non-volatile memory device 120. The ECC engine 112 may provide the non-volatile memory device 120 with the encoding data that is generated based on the write data and may detect and correct an error of the read data obtained from the non-volatile memory device 120. The page type table 113 may include the reliability type information of each of the plurality of pages of the non-volatile memory device 120. The parity table 114 may include the outside parity and mapping information of the outside parity.

In some embodiments, the command manager 111 and the ECC engine 112 may be implemented in the form of a firmware module. For example, the processor 116 may implement the command manager 111 and the ECC engine 112 by loading instructions that are stored in the non-volatile memory device 120 into the volatile memory device 115 and executing the loaded instructions. However, the present disclosure is not limited thereto. For example, the command manager 111 and the ECC engine 112 may be implemented with separate hardware or may be implemented with a combination of hardware and software.

The volatile memory device 115 may be used as a main memory, a buffer memory, or a cache memory of the storage controller 110. The processor 116 may control an overall operation of the storage controller 110. The ROM 117 may be used as a read only memory which may store information that is used in the operation of the storage controller 110.

The storage controller 110 may communicate with the host device 11 through the host interface circuit 118. In some embodiments, the host interface circuit 118 may be implemented based on at least one of various interfaces such as a serial ATA (SATA) interface, a peripheral component interconnect express (PCIe) interface, a serial attached SCSI (SAS), a non-volatile memory express (NVMe) interface, and a universal flash storage (UFS) interface.

The storage controller 110 may communicate with the non-volatile memory device 120 through the non-volatile memory interface circuit 119. In some embodiments, the non-volatile memory interface circuit 119 may be implemented based on the NAND interface.

Figure 3:
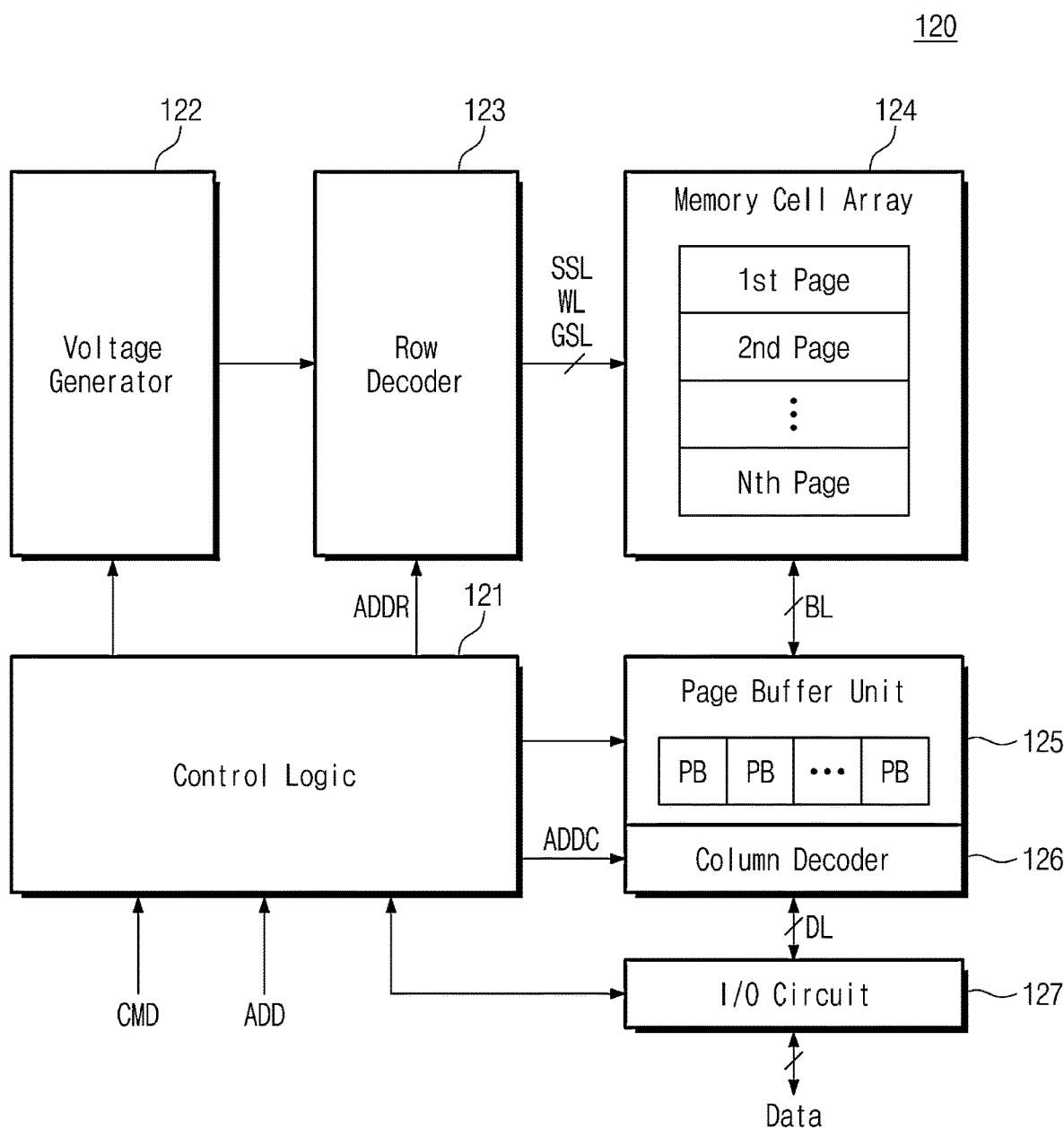
FIG. 3 is a block diagram illustrating a non-volatile memory device of FIG. 1 in detail, according to some embodiments of the present disclosure.

FIG. 3 is a block diagram illustrating a non-volatile memory device of FIG. 1 in greater detail, according to some embodiments of the present disclosure. Referring to FIGS. 1 and 3, the non-volatile memory device 120 may communicate with the storage controller 110. For example, the non-volatile memory device 120 may receive the address ADD and the command CMD from the storage controller 110. The non-volatile memory device 120 may perform data communication with the storage controller 110.

The non-volatile memory device 120 may include control logic 121, a voltage generator 122, a row decoder 123, a memory cell array 124, a page buffer unit 125, a column decoder 126, and an input/output (I/O) circuit 127.

The control logic 121 may receive the command CMD and the address ADD from the storage controller 110. The command CMD may refer to a signal that indicates an operation to be performed by the non-volatile memory device 120, such as a read operation, a write operation, or an erase operation. The address ADD may include a row address ADDR and a column address ADDC. The control logic 121 may control an overall operation of the non-volatile memory device 120 based on the command CMD and the address ADD. The control logic 121 may generate the row address ADDR and the column address ADDC based on the address ADD.

Under control of the control logic 121, the voltage generator 122 may control voltages that are to be applied to the memory cell array 124 through the row decoder 123.

The row decoder 123 may receive the row address ADDR from the control logic 121. The row decoder 123 may be connected to the memory cell array 124 through string selection lines SSL, wordlines WL, and ground selection lines GSL. The row decoder 123 may decode the row address ADDR and may control voltages to be applied to the string selection lines SSL, the wordlines WL, and the ground selection lines GSL based on a decoding result and voltages received from the voltage generator 122.

The memory cell array 124 may include a plurality of memory blocks, and each of the plurality of memory blocks may be a plurality of pages. For example, the memory cell array 124 may include "m" memory blocks, each of which includes "n" pages. In this case, the memory cell array 124 may include a total of N(m×n) pages. Herein, each of "m" and "n" may be an arbitrary natural number.

The memory block may correspond to a physical erase unit of the non-volatile memory device 120, but the present disclosure is not limited thereto. For example, the physical erase unit may be changed to a page unit, word unit, a sub-block unit, or the like.

The page buffer unit 125 may include a plurality of page buffers PB. The page buffer unit 125 may be connected to the memory cell array 124 through bit lines BL. The page buffer unit 125 may read data from the memory cell array 124 in units of page, by sensing voltages of the bit lines BL.

The column decoder 126 may receive the column address ADDC from the control logic 121. The column decoder 126 may decode the column address ADDC and may provide the data that is read by the page buffer unit 125 to the I/O circuit 127 based on a decoding result.

The column decoder 126 may receive data from the I/O circuit 127 through data lines DL. The column decoder 126 may receive the column address ADDC from the control logic 121. The column decoder 126 may decode the column address ADDC and may provide the data that is received from the I/O circuit 127 to the page buffer unit 125 based on a decoding result. The page buffer unit 125 may store the data that is provided from the I/O circuit 127 in the memory cell array 124 through the bit lines BL in units of page (e.g., in page-sized units).

The I/O circuit 127 may be connected to the column decoder 126 through the data lines DL. The I/O circuit 127 may transfer data that is received from the storage controller 110 to the column decoder 126 through the data lines DL. The I/O circuit 127 may provide data that is received through the data lines DL to the storage controller 110.

Figure 4:
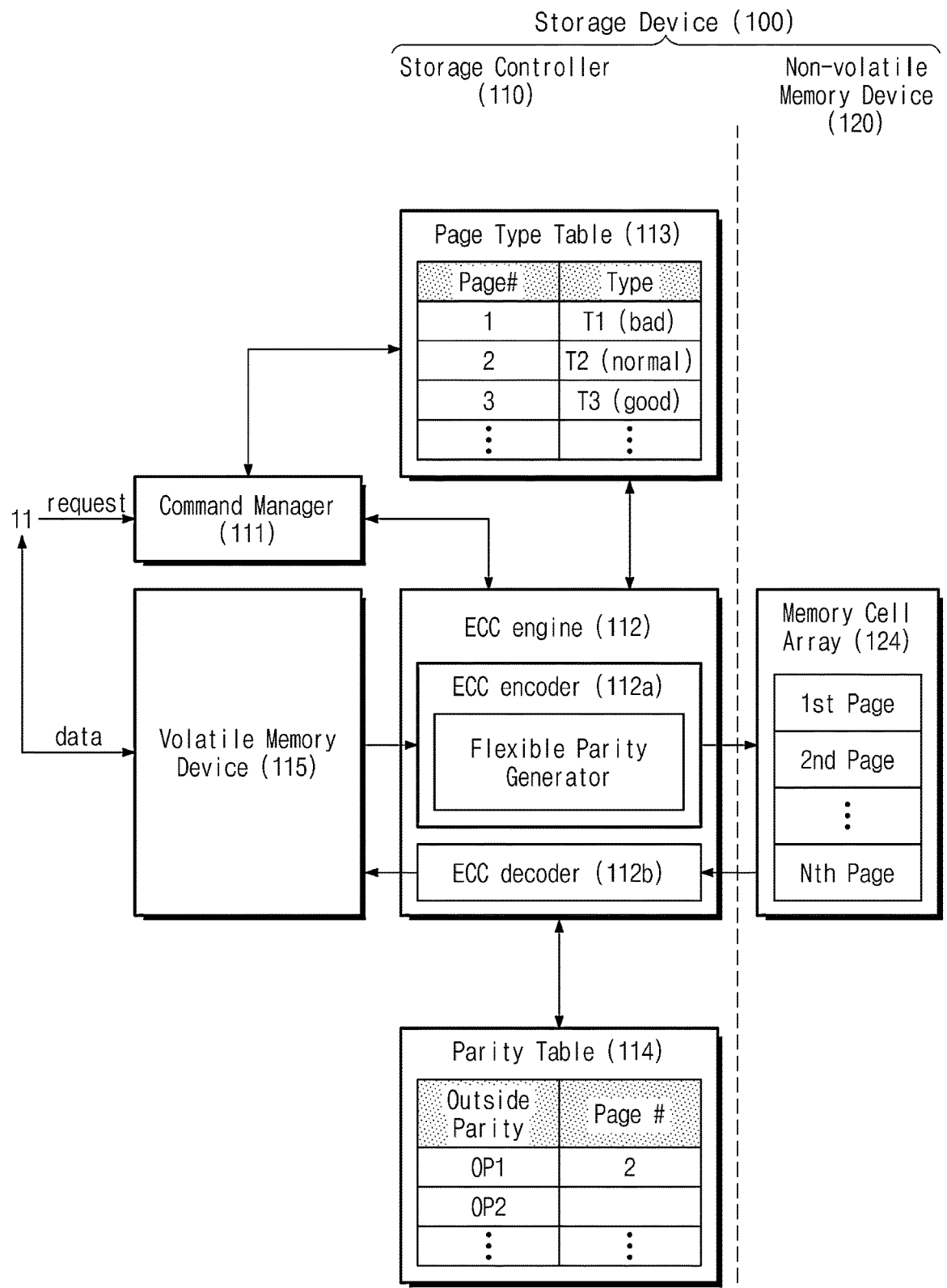
FIG. 4 is a block diagram illustrating a storage controller of FIG. 1 in detail, according to some embodiments of the present disclosure.

FIG. 4 is a diagram illustrating the storage device 100 of FIG. 1 in greater detail, according to some embodiments of the present disclosure. The storage device 100 is illustrated in FIG. 4. The storage device 100 may include the storage controller 110 and the non-volatile memory device 120.

The storage controller 110 may include the command manager 111, the ECC engine 112, the page type table 113, the parity table 114, and the volatile memory device 115.

The non-volatile memory device 120 may include the memory cell array 124. The memory cell array 124 may include a plurality of pages. For example, the memory cell array 124 may include first to N-th pages.

The page type table 113 may include information about a plurality of pages and a plurality of reliability type information respectively corresponding to the plurality of pages.

The parity table 114 may store mapping the outside parity and mapping information of the outside parity.

The command manager 111 may receive a request from the host device 11 of FIG. 1. For example, the command manager 111 may receive a write request for write data from the host device 11. As another example, the command manager 111 may receive a read request from the host device 11 of FIG. 1.

In some embodiments, the command manager 111 may update a mapping table of the storage controller 110. The command manager 111 may determine a physical page (e.g., a page of the memory cell array 124), at which the write data are to be stored, based on a logical page of the write request of the host device 11 and the command manager 111 may store mapping information of the logical page and the physical page in the mapping table (i.e., may update the mapping table). The command manager 111 may provide the ECC engine 112 with page information indicating the page where the write data are to be stored.

In some embodiments, the command manager 111 may generate the read command for the physical page corresponding to the logical page by referring to the mapping table based on the logical page of the read request of the host device 11.

The volatile memory device 115 may receive the write data from the host device 11. The volatile memory device 115 may provide the write data to the command manager 111 and the ECC engine 112. In contrast, the volatile memory device 115 may receive the decoded read data from the ECC engine 112. The volatile memory device 115 may provide the decoded read data to the host device 11.

The ECC engine 112 may include an ECC encoder 112a and an ECC decoder 112b.

The ECC encoder 112a may receive the write data from the volatile memory device 115. The ECC encoder 112a may receive the page information that indicates the page where the write data are to be stored, from the command manager 111. The ECC encoder 112a may obtain the reliability type information of the page where the write data are to be stored, by referring to the page type table 113 based on the page information.

The ECC encoder 112a may include the flexible parity generator. The flexible parity generator may generate the inside parity and the outside parity based on the write data.

The flexible parity generator may generate the flexible parity based on the inside parity of the write data and the reliability type information. The flexible parity generator may determine whether to obtain the outside parity of another write data from the parity table 114, based on the reliability type information. For example, when the reliability type information indicates "good," the flexible parity generator may obtain from the parity table 114 the outside parity of another write data stored at a "bad" or "normal" page. The flexible parity generator may generate the flexible parity based on the inside parity of the write data and the outside parity of the another write data. This will be described in greater detail with reference to FIG. 5.

The ECC encoder 112a may generate the encoding data based on the write data and the flexible parity. The ECC encoder 112a may provide the encoding data to the non-volatile memory device 120. However, the present disclosure is not limited thereto. For example, although not illustrated in FIG. 4, the command manager 111 may receive the encoding data from the ECC encoder 112a. The command manager 111 may provide the non-volatile memory device 120 with the write command that indicates the write operation of the encoding data.

The ECC decoder 112b may receive the read data of a target page from the non-volatile memory device 120. The target page may indicate a page on which the non-volatile memory device 120 performs the read operation based on the read command. The ECC decoder 112b may perform decoding based on the flexible parity or the default parity of the read data. The ECC decoder 112b may fail in decoding of at least a portion of the read data.

For example, the probability that the ECC decoder 112b may fail in decoding when the target page is a normal or bad page is higher than the probability when the target page is a good page. The ECC decoder 112b may obtain mapping information of the outside parity of data stored at the target page by referring to the parity table 114. In greater detail, when the target page is a first page and first outside parity OP1 of first data which are encoded and stored at the first page is mapped to a second page, the ECC decoder 112b may obtain the second page as mapping information by referring to the parity table 114.

The ECC decoder 112b may request that the command manager 111 generate the read command that indicates the read operation of the second page. The non-volatile memory device 120 may provide the read data of the second page to the ECC decoder 112b based on the read command.

The read data of the second page may include the flexible parity associated with the first outside parity OP1. The ECC decoder 112b may obtain the first outside parity OP1 by using the flexible parity. The ECC decoder 112b may again perform decoding of a failed decoding portion by using the first outside parity OP1. This will be described in greater detail with reference to FIG. 8.

The ECC decoder 112b may provide the decoded data to the volatile memory device 115. The volatile memory device 115 may provide the decoded data to the host device 11.

However, the present disclosure is not limited to page-sized reliability units. For example, the storage device 100 may evaluate reliability in units of memory chip, memory block, or word line of a non-volatile memory device.

For example, when the storage device 100 evaluates reliability in units of memory block, the page type table 113 may be referred to as a "memory block type table". The memory block type table may store reliability type information corresponding to each of a plurality of memory blocks. The ECC encoder 112a may obtain the reliability type information of a memory block where the write data are to be stored, by referring to the memory block type table. The parity table 114 may store mapping information between a memory block storing the flexible parity where the outside parity is compressed or included and the outside parity. The ECC decoder 112b may request that the command manager 111 generate the command that indicates the read operation of the memory block mapped to the outside parity of the failed decoding data by referring to the parity table 114. Depending on the reliability of the memory block where the write data are to be stored, the flexible parity generator may generate the flexible parity as in the above description. In greater detail, the flexible parity generator may generate the flexible parity based on the outside parity associated with a memory block whose reliability is low.

Embodiments where the storage device 100 evaluates reliability in units of memory chip or word line may also be implemented as in the above description.

Figure 5:
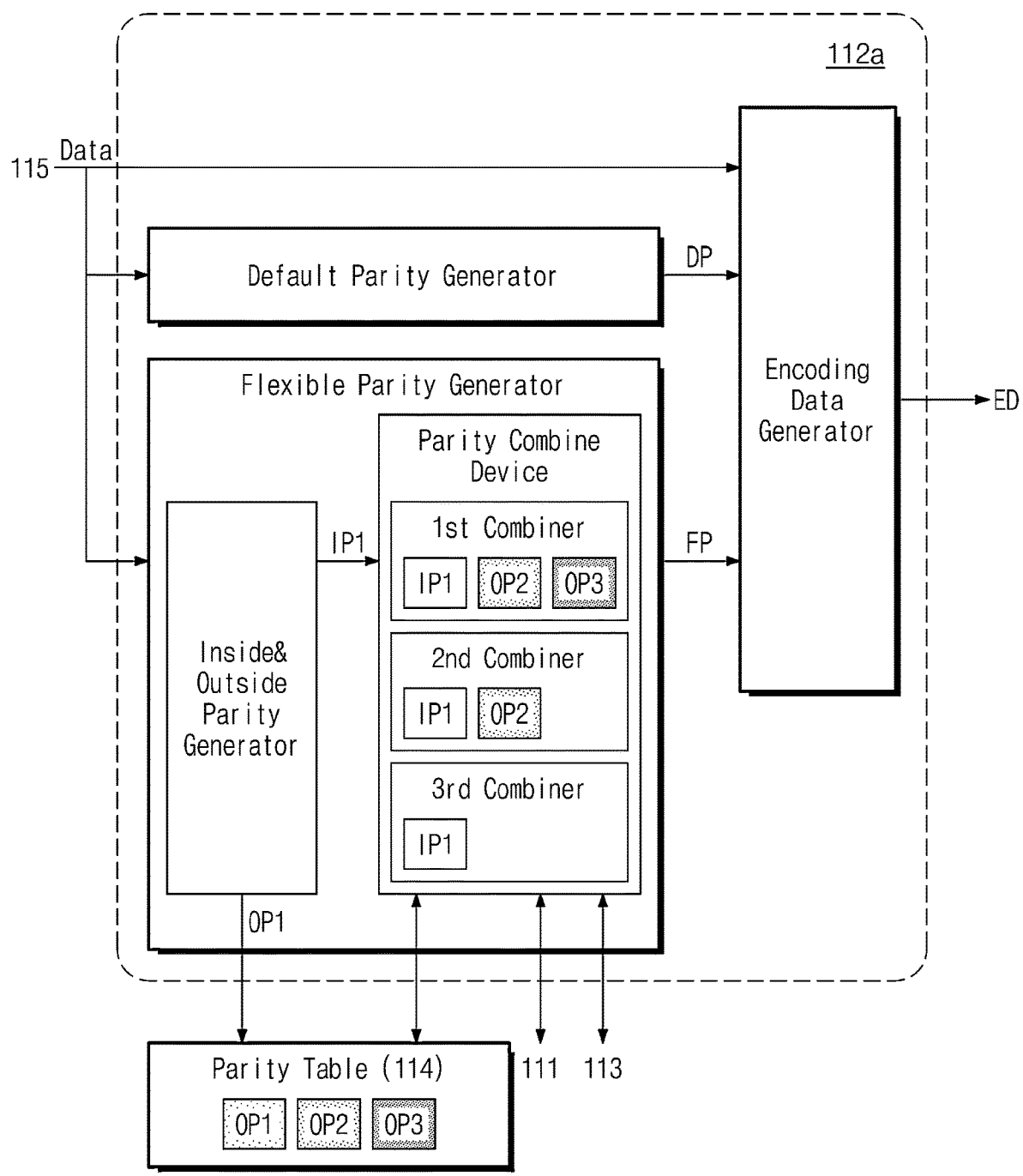
FIG. 5 is a block diagram illustrating an ECC encoder of FIG. 4 in detail, according to some embodiments of the present disclosure.
Figure 6A:
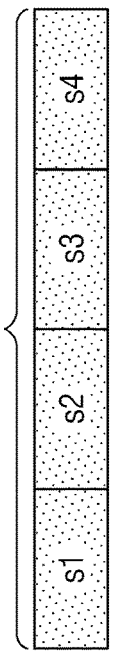
FIG. 6A to 6D are diagrams describing an inside parity and an outside parity according to some embodiments of the present disclosure.
Figure 6B:
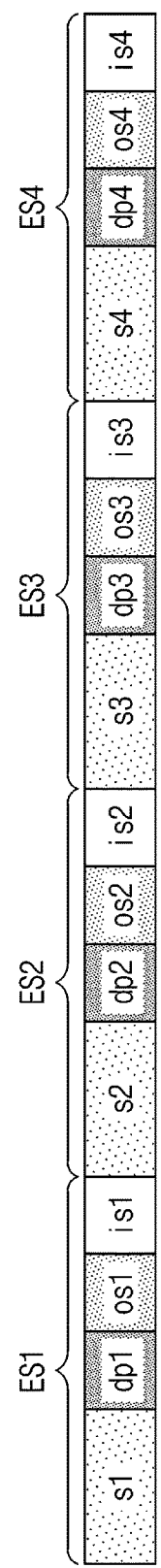
Figure 6C:
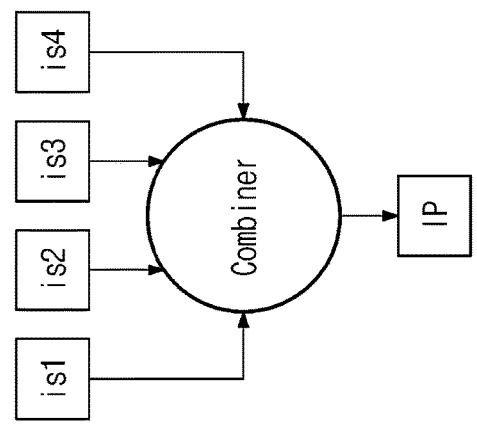
Figure 6D:
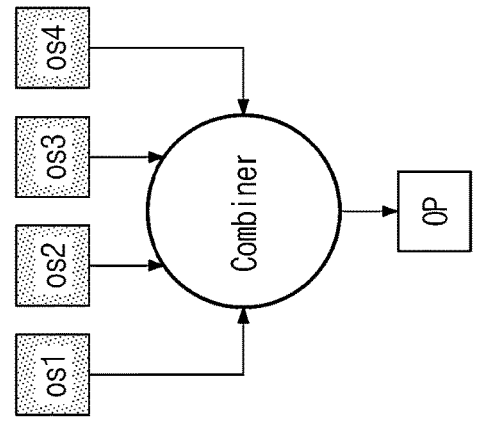

FIG. 5 is a block diagram illustrating the ECC encoder 112a of FIG. 4 in greater detail, according to some embodiments of the present disclosure. The ECC encoder 112a is illustrated in FIG. 5.

The ECC encoder 112a may include a default parity generator, a flexible parity generator, and an encoding data generator.

The default parity generator may receive the write data from the volatile memory device 115 of FIG. 4. The default parity generator may generate a default parity DP by applying a general ECC technique to the write data. FIG. 5 shows that the ECC encoder 112a may include the default parity generator, but the present disclosure is not limited thereto. For example, the default parity generator may be omitted. The default parity generator may provide the default parity DP to the encoding data generator.

The flexible parity generator may include an inside and outside parity generator and a parity combine device.

The inside and outside parity generator may be configured to receive the write data from the volatile memory device 115 of FIG. 4. The inside and outside parity generator may generate a first inside parity IP1 and a first outside parity OP1 based on the write data. The inside and outside parity generator may provide the first inside parity IP1 to the parity combine device. The inside and outside parity generator may store the first outside parity OP1 in the parity table 114.

The parity combine device may obtain page information indicating a first page where the write data are to be stored. The page information may be obtained by the parity combine device from the command manager 111 of FIG. 4. The parity combine device may obtain reliability type information of the first page from the page type table 113 of FIG. 4 based on the page information. The parity combine device may generate a flexible parity FP based on the reliability type information and the first inside parity IP1.

The parity combine device may determine to operate as one of first to third combiners depending on the reliability type information. For example, when the reliability type information has the third reliability value (e.g., a value corresponding to the good state), the parity combine device may determine to operate like the first combiner or in a first combiner mode. When the reliability type information has the second reliability value (e.g., a value corresponding to the normal state), the parity combine device may determine to operate like the second combiner or in a second combiner mode. When the reliability type information has the first reliability value (e.g., a value corresponding to the bad state), the parity combine device may determine to operate like the third combiner or in a third combiner mode.

The parity combine device which operates like the first combiner may obtain the outside parity of the write data stored at the bad or normal page by referring to the parity table 114. For example, the parity combine device may obtain a second outside parity OP2 associated with the bad page and a third outside parity OP3 associated with the normal page. The parity combine device may generate the flexible parity FP based on a combination operation of the first inside parity IP1, the second outside parity OP2, and the third outside parity OP3. For example, the combination operation may be an XOR operation. In this case, the second outside parity OP2 and the third outside parity OP3 may be stored in the parity table 114 before the write data are received.

The parity combine device which operates like the second combiner may obtain the outside parity of the write data stored at the bad page by referring to the parity table 114. For example, the parity combine device may obtain the second outside parity OP2. The parity combine device may generate the flexible parity FP based on the combination operation of the first inside parity IP1 and the second outside parity OP2. In this case, the second outside parity OP2 may be stored in the parity table 114 before the write data are received.

The parity combine device which operates like the third combiner may generate the flexible parity FP by using only the first inside parity IP1, without referring to the parity table 114. For example, the parity combine device may output the flexible parity FP which is the same as the first inside parity IP1.

In some embodiments, the combination operation may be an XOR operation. The number of bits of the flexible parity may be equal to the number of bits of the inside parity or the outside parity. For example, each of the first inside parity IP1, the first outside parity OP1, and the flexible parity FP of the write data may include two bits. However, the present disclosure is not limited thereto. For example, each of the flexible parity, the inside parity, and the outside parity may include one bit or three or more bits.

The parity combine device may provide the flexible parity FP to the encoding data generator.

The encoding data generator may receive the write data, the default parity, and the flexible parity from the volatile memory device 115 of FIG. 4, the default parity generator, and the flexible parity generator, respectively. The encoding data generator may generate encoding data ED based on the write data, the default parity, and the flexible parity. The encoding data generator may provide the encoding data ED to the non-volatile memory device 120 of FIG. 4.

FIG. 6A to 6D are diagrams describing an inside parity and an outside parity according to some embodiments of the present disclosure. The description will be given with reference to FIG. 6A to 6D as the inside and outside parity generator of FIG. 5 generates an inside parity IP and an outside parity OP based on write data. In greater detail, the write data will be described with reference to FIG. 6A, a plurality of encoding sector data ES1 to ES4 generated based on the write data will be described with reference to FIG. 6B, the inside parity IP of the write data will be described with reference to FIG. 6C, and the outside parity OP of the write data will be described with reference to FIG. 6D.

The write data may be data of a page unit (or page data). That is, the write data may be stored at one of a plurality of pages of a non-volatile memory device. The write data may include a plurality of sector data. For example, the write data may include first to fourth sector data s1 to s4. The first to fourth sector data s1 to s4 may have the same size. That is, each of the first to fourth sector data s1 to s4 may include an equal number of bits.

The default parity generator of FIG. 5 may generate first to fourth default parities dp1 to dp4 based on the first to fourth sector data s1 to s4, respectively. For example, the default parity generator may generate the first default parity dp1 by applying a general ECC technique (e.g., a first ECC technique) to the first sector data s1. The default parity generator may generate the second default parity dp2 by applying the general ECC technique to the second sector data s2. The third default parity dp3 and the fourth default parity dp4 may be generated as in the above description. A set of the first to fourth default parities dp1 to dp4 may be referred to as the "default parity DP" of FIG. 5.

For example, the first ECC technique may be a technique of using a first Hamming matrix. The first Hamming matrix will be described in greater detail with reference to FIG. 7.

The inside and outside parity generator of FIG. 5 may generate first to fourth inside sub-parities is1 to is4 based on the first to fourth sector data s1 to s4, respectively and may generate first to fourth outside sub-parities os1 to os4 based on the first to fourth sector data s1 to s4, respectively.

In some embodiments, the inside and outside parity generator may generate the first to fourth inside sub-parities is1 to is4 by applying a second ECC technique to each of the first to fourth sector data s1 to s4. The second ECC technique may be a technique of using a second Hamming matrix. The inside and outside parity generator may generate the first to fourth outside sub-parities os1 to os4 by applying a third ECC technique to each of the first to fourth sector data s1 to s4. The third ECC technique may be a technique of using a third Hamming matrix. The second Hamming matrix and the third Hamming matrix will be described in detail with reference to FIG. 7.

For example, the default parity generator may generate the first default parity dp1 based on the first sector data s1.

The inside and outside parity generator may generate the first inside sub-parity is1 and the first outside sub-parity os1 based on the first sector data s1. A set of the first sector data s1, the first default parity dp1, the first inside sub-parity is1, and the first outside sub-parity os1 may be referred to as "first encoding sector data ES1".

As in the above description, the default parity generator and the inside and outside parity generator may generate the second to fourth encoding sector data ES2 to ES4 based on the second to fourth sector data s2 to s4, respectively.

The inside and outside parity generator may generate the inside parity IP from the first to fourth inside sub-parities is1 to is4 by using a combiner. The combiner may generate the inside parity IP based on the combination operation of the first to fourth inside sub-parities is1 to is4. For example, the combination operation may be an XOR operation.

The inside and outside parity generator may generate the outside parity OP from the first to fourth outside sub-parities os1 to os4 by using a combiner. The combiner may generate the outside parity OP based on the combination operation of the first to fourth outside sub-parities os1 to os4. For example, the combination operation may be an XOR operation.

FIG. 7 describes Hamming matrixes or matrices according to some embodiments of the present disclosure. The first Hamming matrix, the second Hamming matrix, and the third Hamming matrix are illustrated in FIG. 7. For convenience of description, an example in which the number of bits of one sector data belonging to write data is 2 will be described.

The Hamming matrix may be a matrix of explaining the concept of parity and may be a generator matrix which generates a parity for error detection and correction of data.

The first Hamming matrix may generate default parities. One row among a plurality of rows of the first Hamming matrix may include bit values of the sector data and a bit value of a default parity corresponding to the bit values of the sector data. The corresponding default parity may be determined based on an ECC algorithm which a general ECC engine uses.

For example, the first Hamming matrix may include a matrix with four row and three columns. The first column and the second column of the first Hamming matrix may indicate all possible combinations of bit values of the sector data. For example, all possible combinations of bit values of the sector data being 2-bit data may be "00", "01", "10", and "11". The third column may include the first to fourth default parities dpp1 to dpp4, each of which is determined based on an ECC algorithm depending on bit values of the first column and the second column belonging to each row. For example, the ECC algorithm may be an algorithm which determines a default parity dp allowing the number of first bit values (e.g., the number of 1s) among bit values of both the sector data and the default parity dp to be even-numbered (or odd-numbered).

Each of first to fourth default parities dpp1 to dpp4 may include one of a first bit value (e.g., 1) and a second bit value (e.g., 0).

For example, the first default parity dpp1 of the first Hamming matrix may be determined based on a value at the first row and first column of the first Hamming matrix, a value at the first row and second column of the first Hamming matrix, and the ECC algorithm.

In other words, when the bit values of the first sector data s1 of FIG. 6 are "00", the ECC encoder 112a may determine the first default parity dpp1 as the first default parity dp1 of FIG. 6. When the bit values of the first sector data s1 of FIG. 6 are "01", the ECC encoder 112a may determine the second default parity dpp2 as the first default parity dp1 of FIG. 6. When the bit values of the first sector data s1 of FIG. 6 are "10", the ECC encoder 112a may determine the third default parity dpp3 as the first default parity dp1 of FIG. 6. When the bit values of the first sector data s1 of FIG. 6 are "11", the ECC encoder 112a may determine the fourth default parity dpp4 as the first default parity dp1 of FIG. 6.

The second Hamming matrix may generate inside sub-parities. One row among a plurality of rows of the second Hamming matrix may include the bit values of the sector data and a bit value of an inside sub-parity isp.

For example, the second Hamming matrix may include a matrix with four row and four columns. The second Hamming matrix may correspond to the fifth to eighth rows of an integrate Hamming matrix. The first column and the second column of the second Hamming matrix may indicate all possible combinations of the bit values of the sector data. The third column may be a column having an element value of "0". The fourth column may include the first to fourth inside sub-parities isp1 to isp4, each of which is determined depending on bit values of the first column and the second column belonging to each row. Each of the first to fourth inside sub-parities isp1 to isp4 may include one of a first bit value (e.g., 1) and a second bit value (e.g., 0).

For example, the first inside sub-parity isp1 of the second Hamming matrix may be determined based on a value at the first row and first column of the second Hamming matrix, a value at the first row and second column of the second Hamming matrix, and an ECC algorithm.

In other words, when the bit values of the first sector data s1 of FIG. 6 are "00", the ECC encoder 112a may determine the first inside sub-parity isp1 as the first inside sub-parity is1 of FIG. 6. When the bit values of the first sector data s1 of FIG. 6 are "01", the ECC encoder 112a may determine the second inside sub-parity isp2 as the first inside sub-parity is1 of FIG. 6. When the bit values of the first sector data s1 of FIG. 6 are "10", the ECC encoder 112a may determine the third inside sub-parity isp3 as the first inside sub-parity is1 of FIG. 6. When the bit values of the first sector data s1 of FIG. 6 are "11", the ECC encoder 112a may determine the fourth inside sub-parity isp4 as the first inside sub-parity is1 of FIG. 6.

The third Hamming matrix may generate outside sub-parities. One among a plurality of rows of the third Hamming matrix may include the bit values of the sector data and a bit value of an outside sub-parity osp.

For example, the third Hamming may include a matrix with four row and five columns. The third Hamming matrix may correspond to the ninth to twelfth rows of the integrate Hamming matrix. The first column and the second column of the third Hamming matrix may indicate all possible combinations of the bit values of the sector data. Each of the third column and the fourth column may be a column having an element value of "0". The fifth column may include first to fourth outside sub-parities osp1 to osp4, each of which is determined depending on bit values of the first column and the second column belonging to each row. Each of the first to fourth outside sub-parities osp1 to osp4 may one of a bit value of "0" and a bit value of "1".

For example, the first outside sub-parity osp1 of the third Hamming matrix may be determined based on a value at the first row and first column of the third Hamming matrix, a value at the first row and second column of the third Hamming matrix, and an ECC algorithm.

In other words, when the first sector data s1 of FIG. 6 are 2-bit data and the bit values of the first sector data s1 of FIG. 6 are "00", the ECC encoder 112a may determine the first outside sub-parity osp1 as the first outside sub-parity os1 of FIG. 6. As another example, when the bit values of the first sector data s1 of FIG. 6 are "01", the ECC encoder 112a may determine the second outside sub-parity osp2 as the first outside sub-parity os1 of FIG. 6. When the bit values of the first sector data s1 of FIG. 6 are "10", the ECC encoder 112a may determine the third outside sub-parity osp3 as the first outside sub-parity os1 of FIG. 6. As another example, when the bit values of the first sector data s1 of FIG. 6 are "11", the ECC encoder 112a may determine the fourth outside sub-parity osp4 as the first outside sub-parity os1 of FIG. 6.

Herein, description is given as each of the default parities dpp, the inside sub-parities isp, and the outside sub-parities osp includes one bit, but the present disclosure is not limited thereto. For example, the number of bits of sector data may be less or more than 2; in this case, in each Hamming matrix, the number of rows and the number of columns may also change.

The description is given as the general ECC engine, that is, the default parity generator of FIG. 5 generates the default parity DP as a parity by using the first Hamming matrix, but the present disclosure is not limited thereto. The first Hamming matrix described above may be integrated with the second Hamming matrix and the third Hamming matrix by adding the fourth column and the fifth column having a element value of "0" to the first Hamming matrix described above. In other words, the ECC engine may use one integrate Hamming matrix where the first to third Hamming matrixes are integrated. The ECC engine may simultaneously generate the default parity, the inside sub-parity, and the outside sub-parity by using the integrate Hamming matrix, based on sector data.

Figure 8:
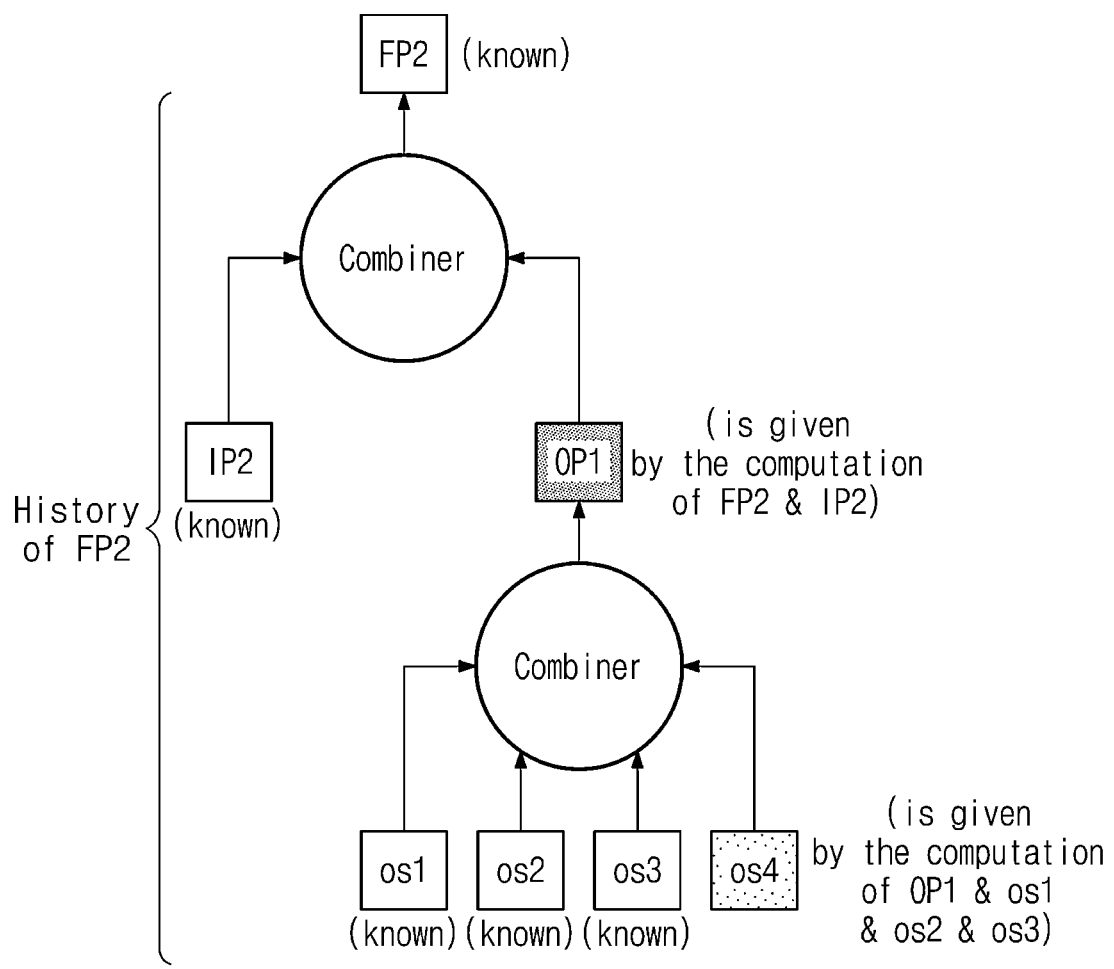
FIG. 8 is a diagram describing decoding according to some embodiments of the present disclosure.

FIG. 8 is a diagram describing decoding according to some embodiments of the present disclosure. A decoding principle of the ECC decoder 112b of FIG. 4 will be described with reference to FIG. 8.

First, a non-volatile memory device may store the write data of FIG. 6 at a first page as first write data. The first write data may include first to fourth sector data. The first page may be a bad page or a normal page.

The ECC decoder 112b may obtain first read data of the first page from the non-volatile memory device. Based on the first read data, the ECC decoder 112b may succeed in the decoding of the first to third sector data but may fail in the decoding of the fourth sector data.

Based on that the decoding of the first read data of the first page fails, the ECC decoder 112b may obtain page information (e.g., a second page) mapped to the first outside parity OP1 of the first write data by referring to the parity table 114 of FIG. 4. The ECC decoder 112b may request a command manager to generate the read command indicating the read operation on the second page.

The ECC decoder 112b may obtain second read data of the second page from the non-volatile memory device. The second read data layer may include second flexible parity FP2.

Returning to FIG. 8, the second flexible parity FP2 may be generated by the combination operation of the second inside parity IP2 of the second write data stored at the second page and the first outside parity OP1 of the first write data. For example, the combination operation may be an XOR operation. In this case, the first outside parity OP1 may be inversely calculated based on the second flexible parity FP2 and the second inside parity IP2. The second inside parity IP2 may be obtained by decoding, at the ECC decoder 112b, the second read data obtained from the non-volatile memory device. That is, the first outside parity OP1 may be calculated.

The first outside parity OP1 may be generated based on the combination operation of the first to fourth outside sub-parities os1 to os4 of the first write data. The first to fourth outside sub-parities os1 to os4 respectively correspond to the first to fourth outside sub-parities os1 to os4 of FIG. 6. For example, the combination operation may be an XOR operation. In this case, the fourth outside sub-parity os4 may be inversely calculated based on the first outside parity OP1 and the first to third outside sub-parities os1 to os3. The first to third outside sub-parities os1 to os3 may be obtained based on the first to third sector data whose decoding is successfully performed by the ECC decoder 112b. That is, the fourth outside sub-parity os4 may be calculated.

The ECC decoder 112b may again perform decoding for the fourth sector data experiencing the failed decoding, based on the fourth outside sub-parity os4.

However, the present disclosure is not limited thereto. For example, even when the decoding of two or more sector data among the first to fourth sector data fails, the storage device may again perform decoding as in the above description.

Accordingly, as the reliability of data stored at a page whose reliability is low is improved or guaranteed, the reliability of the storage device may be improved.

Figure 9:
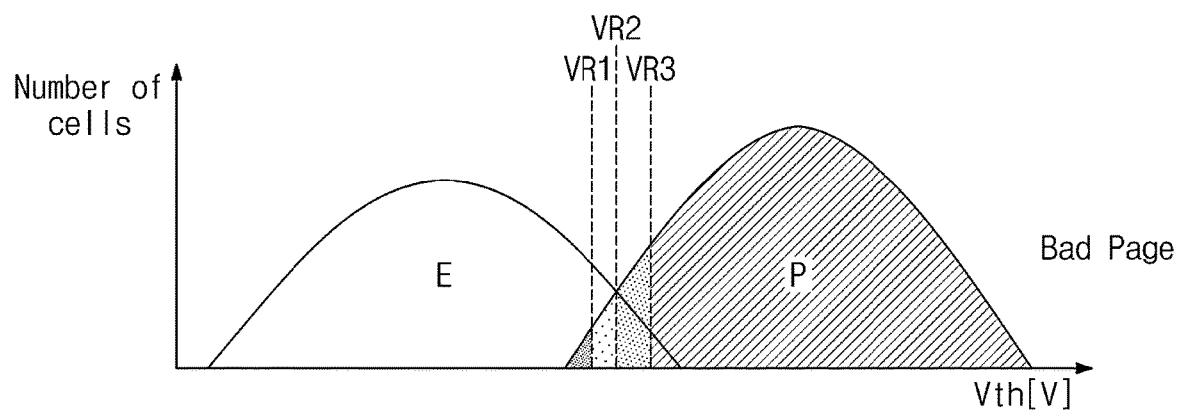
FIG. 9 is a diagram describing reliability type information of a page according to some embodiments of the present disclosure.
Figure 9:
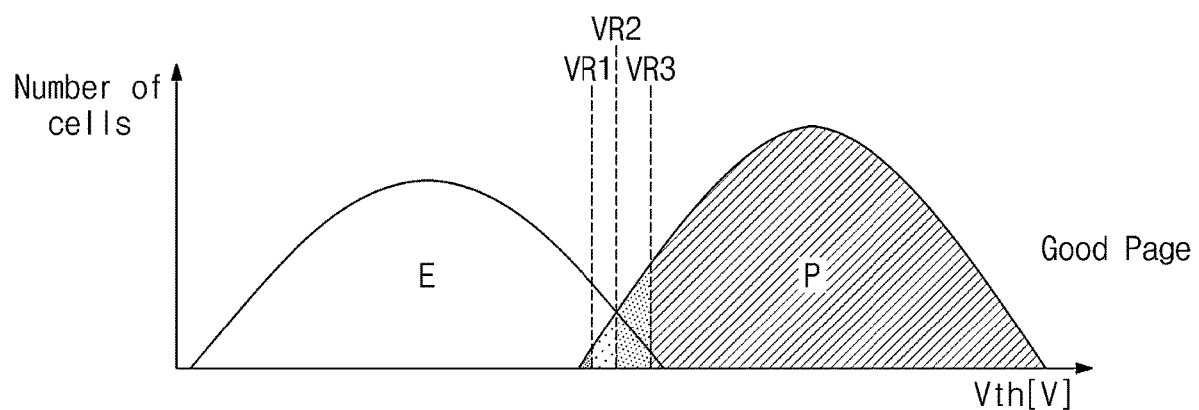
Figure 9:
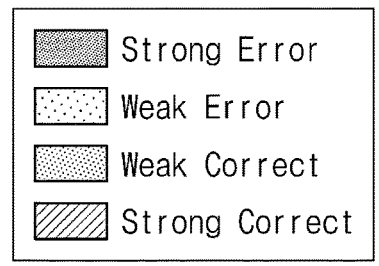

FIG. 9 is a diagram describing reliability type information of a page according to some embodiments of the present disclosure. Threshold voltage distribution graphs of single level cells (hereinafter referred to as an "SLC threshold voltage distribution") included in two page whose reliability type information are different are illustrated in FIG. 9. The single level cell may store one bit.

First, the reliability type information of the page may indicate a reliable zone including the reliability of the page. The reliability of the page may be calculated based on a threshold voltage distribution of the memory cells of the page.

Referring to the SLC threshold voltage distribution graph, the horizontal axis represents a threshold voltage (e.g., a level of a threshold voltage), and the vertical axis represents the number of memory cells. The single level cell may have one of an erase state "E" and a programming state "P" whose threshold voltage distributions sequentially increase.

A storage device may calculate the reliability of the page based on a plurality of read voltage levels. Each of the plurality of read voltage levels may be used to distinguish the erase state "E" from the programming state "P". For example, the plurality of read voltage levels may include first to third read voltage levels VR1 to VR3.

the second read voltage level VR2 may be a voltage level of a valley optimized to distinguish memory cells of the erase state "E" from memory cells of the programming state "P". The optimized valley may indicate a voltage level at which the number of memory cells each determined as an error bit (i.e., the number of memory cells each determined as a bit opposite to a programmed bit) is minimized.

The first read voltage level VR1 may be lower than the second read voltage level VR2. The third read voltage level VR3 may be higher than the second read voltage level VR2.

In some embodiments, the storage device may calculate the reliability of the page based on at least one of ratios of the number of first memory cells each determined as error bits based on the first read voltage level VR1 among the plurality of read voltage levels and the number of second memory cells each determined as an correct bit (i.e., the number of memory cells each determined as a bit opposite to a programmed bit) based on the first read voltage level VR1 and a ratio of the number of third memory cells each determined as an error bit based on the second read voltage level VR2 among the plurality of read voltage levels and the number of fourth memory cells each determined as an correct bit based on the second read voltage level VR2.

In some embodiments, the storage device may calculate the reliability of the page based on a ratio of two of the number of first memory cells, the number of second memory cells, the number of third memory cells, and the number of fourth memory cells. In greater detail, the reliability may be calculated based on the ratio of the number of second memory cells to the number of first memory cells. As another example, the reliability may be calculated based on the ratio of the number of fourth memory cells to the number of third memory cells.

As another example, as the number of first memory cells and the number of second memory cells become smaller and the number of third memory cells and the number of fourth memory cells become greater, the reliability may increase.

In some embodiments, the memory cells corresponding to the programming state "P" may be divided into four regions in the threshold voltage distribution graph, based on the first to third read voltage levels VR1 to VR3. The four regions may include a strong error region, a weak error region, a weak correct region, and a strong correct region. The strong error region and the weak error region may include memory cells each determined as an error bit.

In greater detail, the strong error region and the weak error region may be distinguished from each other by the first read voltage level VR1. The weak error region and the weak correct region may be distinguished from each other by the second read voltage level VR2. The weak correct region and the strong correct region may be distinguished from each other by the third read voltage level VR3.

For example, as the number of memory cells included in the strong error region and the weak error region increases, the reliability may become lower. As the number of memory cells included in the weak correct region and strong correct region increases, the reliability may become higher.

As another example, the reliability may be calculated based on a ratio of the number of memory cells included in the strong correct region to the number of memory cells included in the strong error region.

The number of memory cells included in the strong error region and the weak error region of the bad page whose reliability is relatively low is more than number of memory cells included in the strong error region and the weak error region of the good page whose reliability is relatively high. In contrast, the number of memory cells included in the weak correct region and the strong correct region of the bad page whose reliability is relatively low is less than number of memory cells included in the weak correct region and the strong correct region of the good page whose reliability is relatively high.

Figure 10:
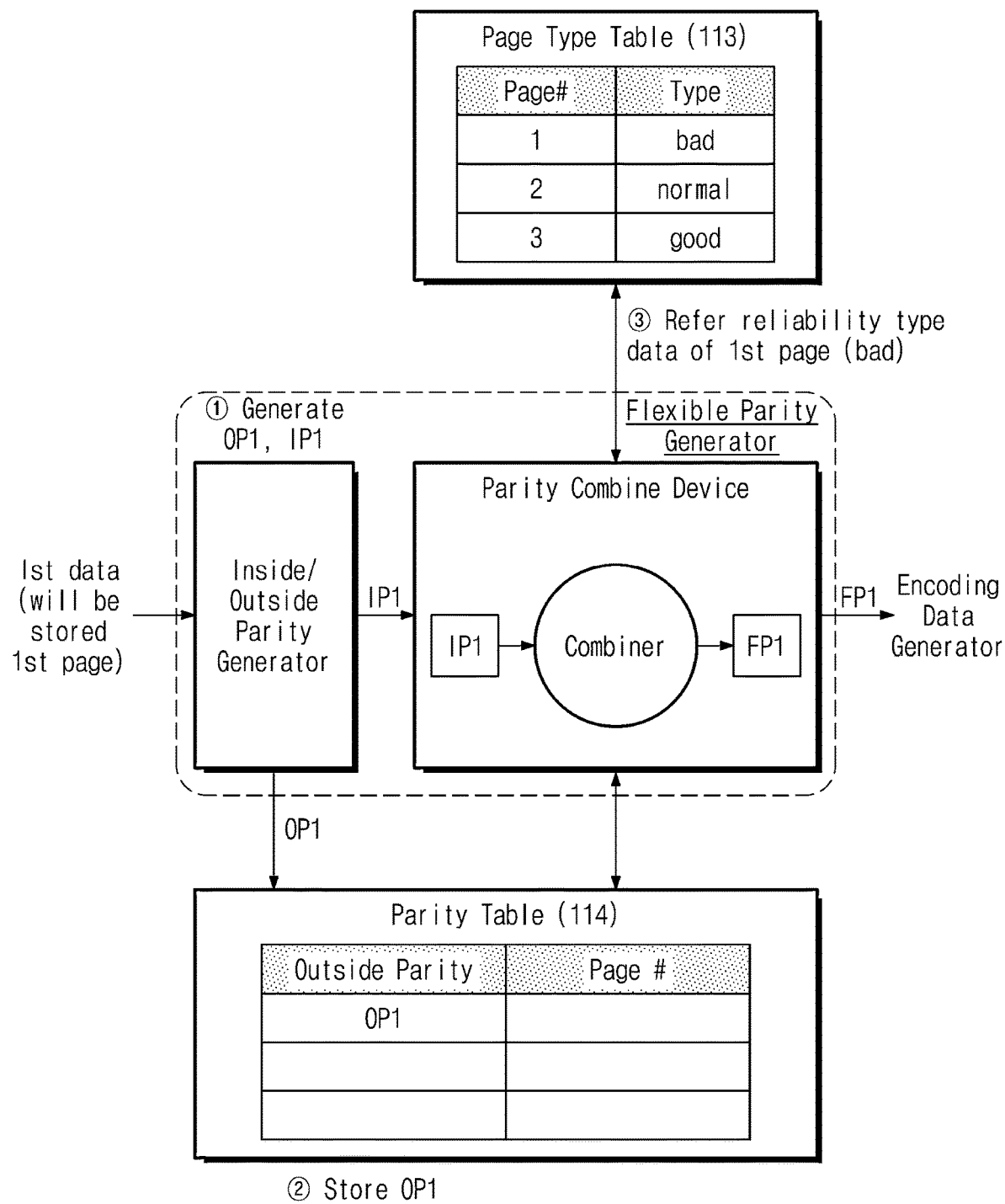
FIG. 10 is a diagram describing a method of generating a flexible parity to be stored at a bad page, according to some embodiments of the present disclosure.
Figure 11:
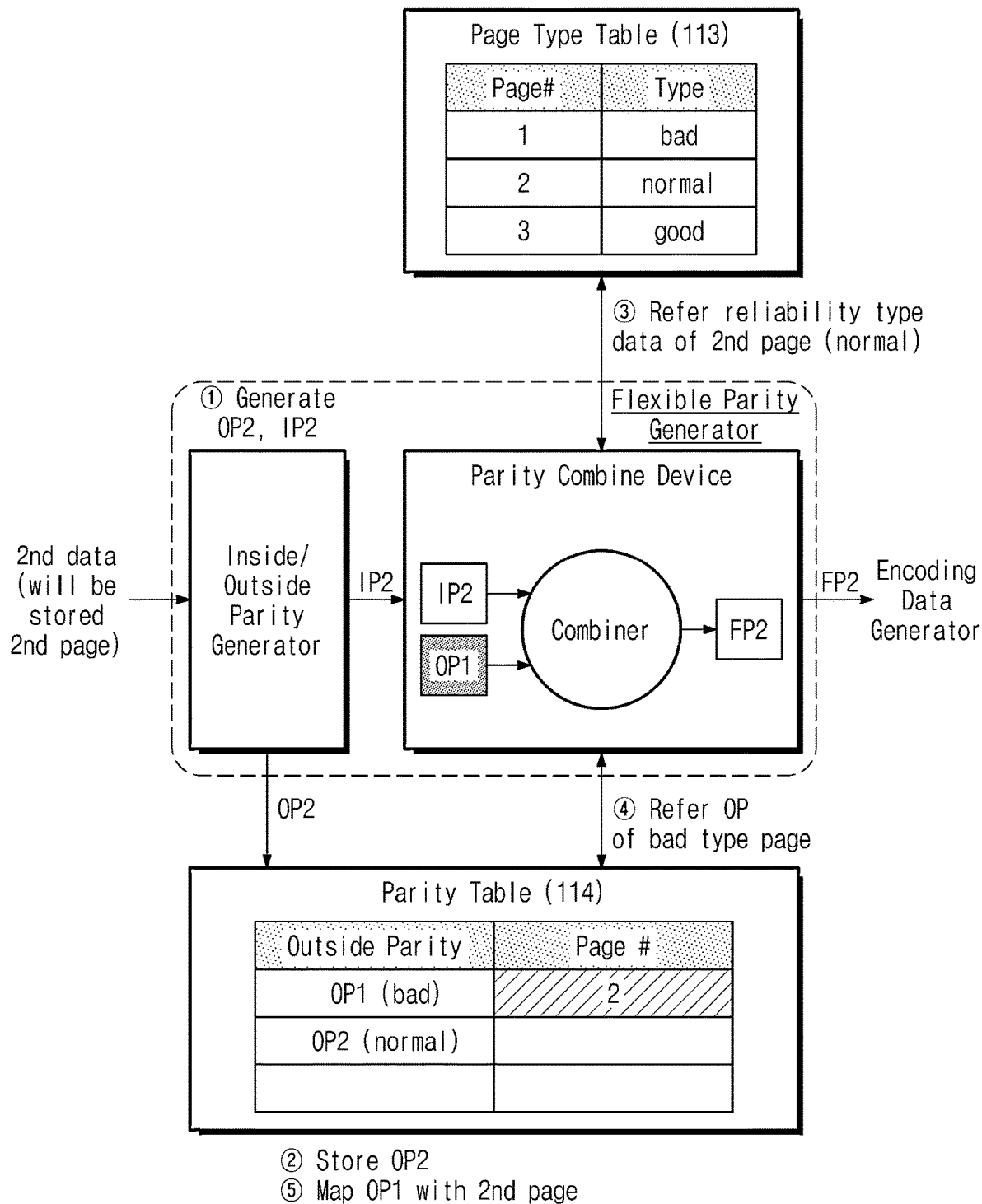
FIG. 11 is a diagram describing a method of generating a flexible parity to be stored at a normal page, according to some embodiments of the present disclosure.
Figure 12:
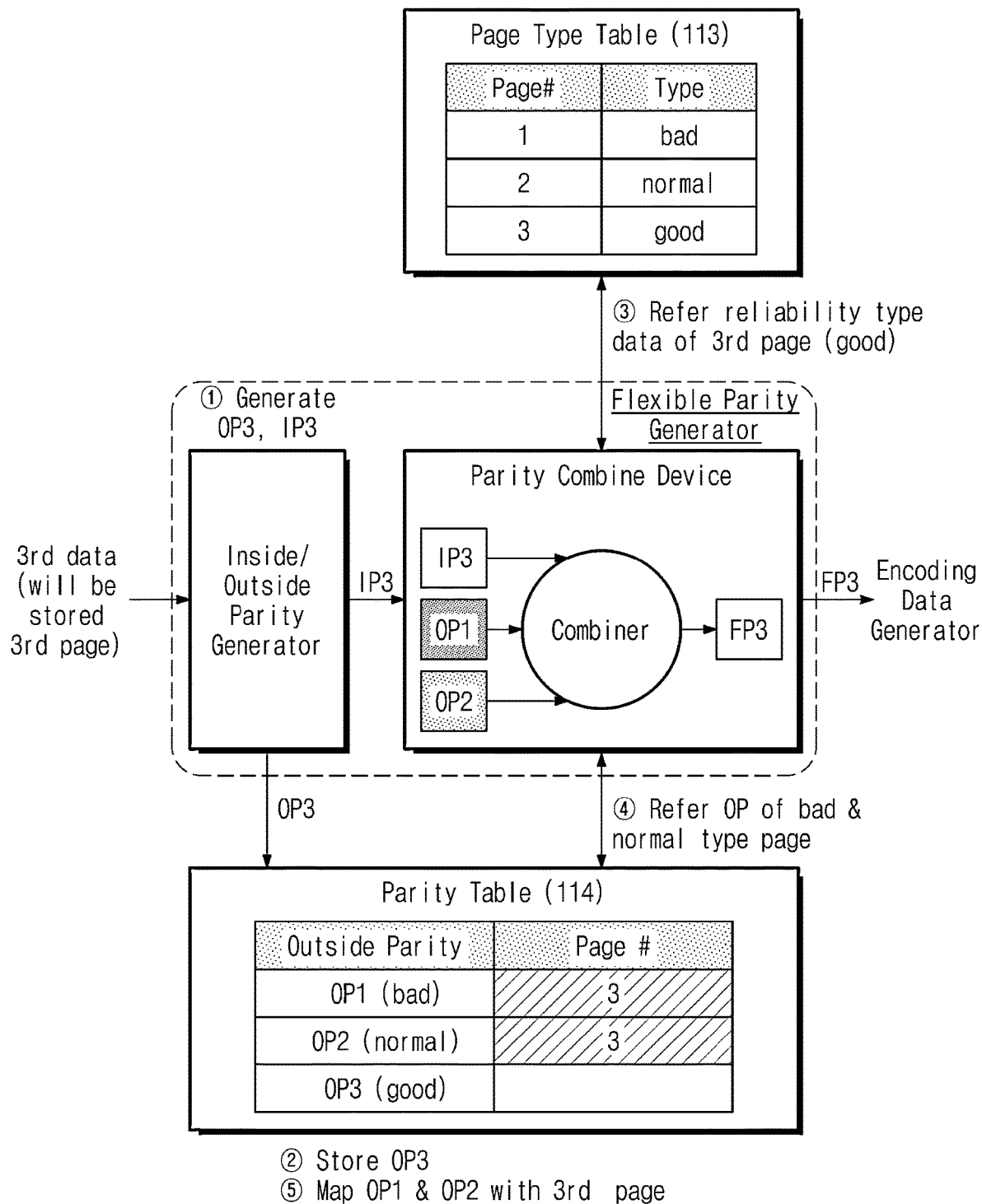
FIG. 12 is a diagram describing a method of generating a flexible parity to be stored at a good page, according to some embodiments of the present disclosure.

FIGS. 10 to 12 are diagrams describing a method of generating a flexible parity which varies depending on reliability type information of a page where write data are to be stored. A storage controller may include a flexible parity generator, the page type table 113, and the parity table 114. The flexible parity generator, the page type table 113, and the parity table 114 of FIGS. 10 to 12 may correspond respectively to the flexible parity generator, the page type table 113, and the parity table 114 of FIGS. 4 and 5.

The flexible parity generator may include an inside and outside parity generator and a parity combine device. The inside and outside parity generator may generate an inside parity and an outside parity based on write data received from a volatile memory device. The parity table 114 may store the outside parity. The parity combine device may obtain reliability type information of a page where the write data are to be stored, by referring to the page type table 113. The parity combine device may generate a flexible parity based on the inside parity of the write data and the reliability type information. The parity combine device may provide the flexible parity to an encoding data generator.

FIG. 10 is a diagram describing a method of generating a flexible parity to be stored at a bad page, according to some embodiments of the present disclosure. A method of generating a flexible parity to be stored at a bad page will be described with reference to FIG. 10.

In a first operation ①, the inside and outside parity generator may generate the first inside parity IP1 and the first outside parity OP1 based on first data which are received from the volatile memory device and are to be stored at a first page. The inside and outside parity generator may provide the first inside parity IP1 to the parity combine device and may provide the first outside parity OP1 to the parity table 114.

In a second operation ②, the inside and outside parity generator may store the first outside parity OP1 in the parity table 114.

In a third operation ③, the parity combine device may receive first reliability type information (e.g., corresponding to the bad state as the first reliability type) of the first page by referring to the page type table 113. Based on that the first page is of the first reliability type, the parity combine device may generate the first flexible parity FP1 based on the first inside parity IP1 and the first reliability type information. For example, the parity combine device may generate the first flexible parity FP1 which is the same as the first inside parity IP1. In this case, the parity combine device may not refer to the parity table 114.

The parity combine device may provide the first flexible parity FP1 to the encoding data generator.

FIG. 11 is a diagram describing a method of generating a flexible parity to be stored at a normal page, according to some embodiments of the present disclosure. A method of generating a flexible parity to be stored at a normal page will be described with reference to FIG. 11.

In a first operation ①, the inside and outside parity generator may generate the second inside parity IP2 and the second outside parity OP2 based on second data which are received from the volatile memory device and are to be stored at a second page. The inside and outside parity generator may provide the second inside parity IP2 to the parity combine device and may provide the second outside parity OP2 to the parity table 114.

In a second operation ②, the inside and outside parity generator may store the second outside parity OP2 in the parity table 114.

In a third operation ③, the parity combine device may obtain second reliability type information (e.g., corresponding to the normal state as the second reliability type) of the second page by referring to the page type table 113.

In a fourth operation ④, based on that the second reliability type information indicates the second reliability type, the parity combine device may obtain an outside parity of data stored at a bad page by referring to the parity table 114. For example, the outside parity of the data stored at the bad page may be the first outside parity OP1 of FIG. 10.

The parity combine device may generate the second flexible parity FP2 based on the combination operation of the second inside parity IP2 and the first outside parity OP1. The parity combine device may provide the second flexible parity FP2 to the encoding data generator.

In a fifth operation ⑤, based on that the parity combine device uses the first outside parity OP1 to generate the second flexible parity FP2, the parity table 114 may map the second page to the first outside parity OP1. That is, the parity table 114 may store mapping information between the first outside parity OP1 and the second page storing the second flexible parity FP2 associated with the first outside parity OP1.

FIG. 12 is a diagram describing a method of generating a flexible parity to be stored at a good page, according to some embodiments of the present disclosure. A method of generating a flexible parity to be stored at a good page will be described with reference to FIG. 12.

In a first operation ①, the inside and outside parity generator may generate the third inside parity IP3 and the third outside parity OP3 based on third data which are received from the volatile memory device and are to be stored at a third page. The inside and outside parity generator may provide the third inside parity IP3 to the parity combine device and may provide the third outside parity OP3 to the parity table 114.

In a second operation ②, the inside and outside parity generator may store the third outside parity OP3 in the parity table 114.

In a third operation ③, the parity combine device may obtain third reliability type information (e.g., corresponding to the at the good state as the third reliability type) of the third page by referring to the page type table 113.

In a fourth operation ④, based on that the third reliability type information indicates the third reliability type, the parity combine device may at least obtain an outside parity of data stored at a bad page or normal page by referring to the parity table 114. For example, the outside parity of the data stored at the bad page may be the first outside parity OP1 of FIG. 10. The outside parity of the data stored at the normal page may be the second outside parity OP2 of FIG. 11. That is, the parity combine device may obtain the first outside parity OP1 and the second outside parity OP2 by referring to the parity table 114.

The parity combine device may generate a third flexible parity FP3 based on the combination operation of the third inside parity IP3, the first outside parity OP1, and the second outside parity OP2. The parity combine device may provide the third flexible parity FP3 to the encoding data generator.

In a fifth operation ⑤, based on that the parity combine device uses the first outside parity OP1 and the second outside parity OP2 to generate the third flexible parity FP3, the parity table 114 may map the third page to each of the first outside parity OP1 and the second outside parity OP2. That is, the parity table 114 may store mapping information between the first outside parity OP1 and the third page storing the third flexible parity FP3 associated with the first outside parity OP1 and the second outside parity OP2. Also, the parity table 114 may store mapping information between the third page and the second outside parity OP2.

Figure 13:
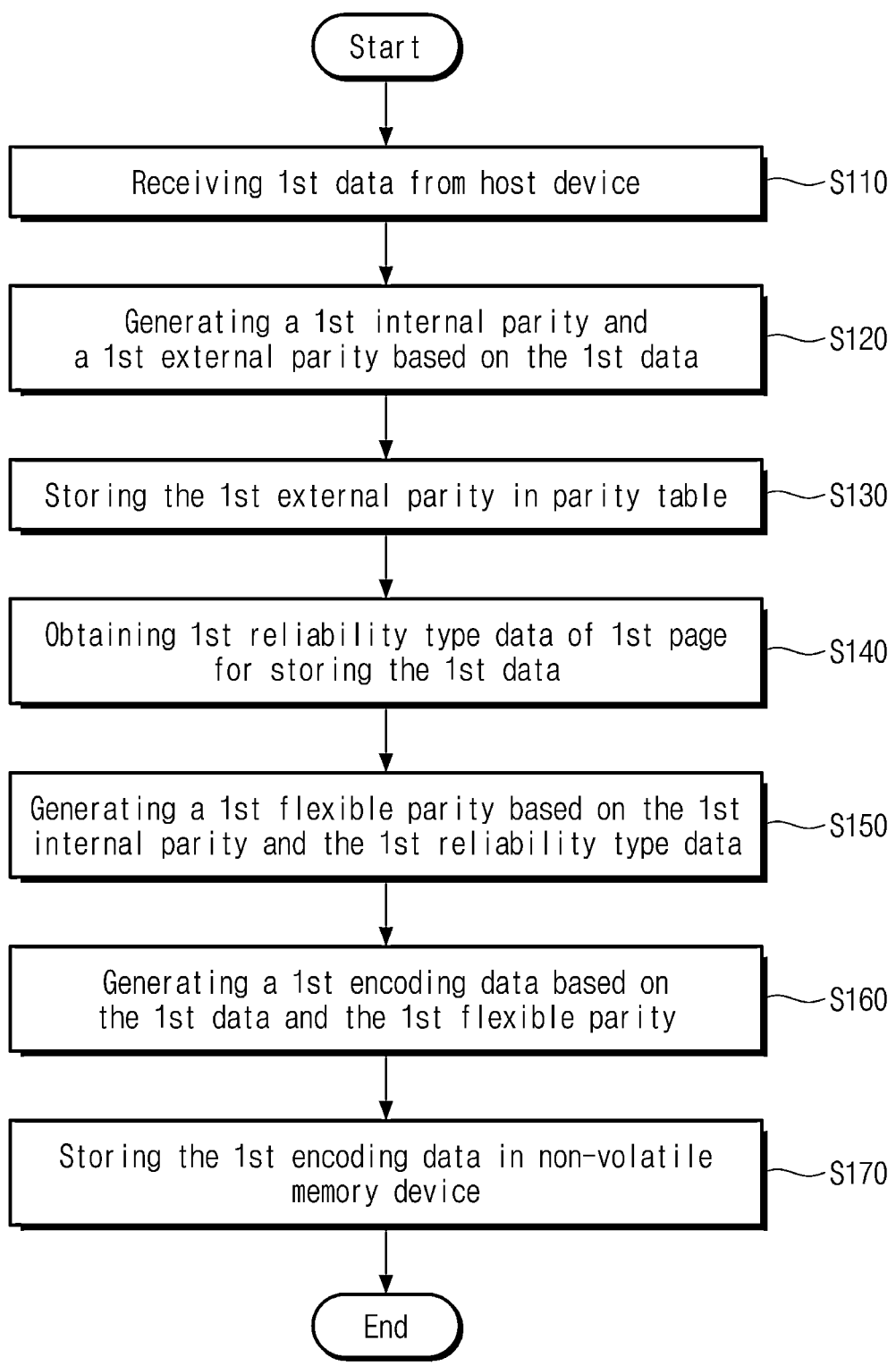
FIG. 13 is a flowchart describing an operation in which a storage device encodes write data so as to be stored in a non-volatile memory device, according to some embodiments of the present disclosure.

FIG. 13 is a flowchart describing an operation in which a storage device encodes write data that may be stored in a non-volatile memory device, according to some embodiments of the present disclosure. An operation in which a storage device encodes write data that may be stored in a non-volatile memory device will be described with reference to FIG. 13. The storage device may include a storage controller and a non-volatile memory device. The storage controller and the non-volatile memory device may respectively correspond to the storage controller 110 and the non-volatile memory device 120 of FIG. 4.

In operation S110, an ECC engine of the storage device may receive first data from a host device. The first data may be write data to be stored at a first page.

In operation S120, the ECC engine of the storage device may generate a first inside parity and a first outside parity, based on the first data.

In some embodiments, the first data may be divided into first to fourth sector data. Operation S120 may include generating, by the ECC engine, first to fourth inside sub-parities and first to fourth outside sub-parities based on the first to fourth sector data, generating the first inside parity based on a combination operation of the first to fourth inside sub-parities, and generating the first outside parity based on the combination operation of the first to fourth outside sub-parities.

In some embodiments, the combination operation may be an XOR operation.

In operation S130, the storage device may store the first outside parity in a parity table.

In operation S140, the ECC engine of the storage device may obtain first reliability type information of the first page by referring to a page type table.

In operation S150, the ECC engine of the storage device may generate a first flexible parity based on the first inside parity and the first reliability type information.

In some embodiments, when the first reliability type information indicates "Bad," the ECC engine may generate the first flexible parity which are the same as the first inside parity.

In some embodiments, when the first reliability type information indicates "Normal," operation S150 may include obtaining, by the ECC engine, a second outside parity of write data stored at a bad page by referring to the parity table, and generating the first flexible parity based on a combination operation of the first inside parity and the second outside parity.

In some embodiments, when the first reliability type information indicates "Good," operation S150 may include obtaining, by the ECC engine, a second outside parity of write data stored at a bad page by referring to the parity table, obtaining a third outside parity of write data stored at a normal page by referring to the parity table, and generating the first flexible parity based on a combination operation of the first inside parity, the second outside parity, and the third outside parity.

In operation S160, the storage device may generate first encoding data based on the first data and the first flexible parity, by using the ECC engine.

In operation S170, the storage device may store the first encoding data in the non-volatile memory device.

Figure 14:
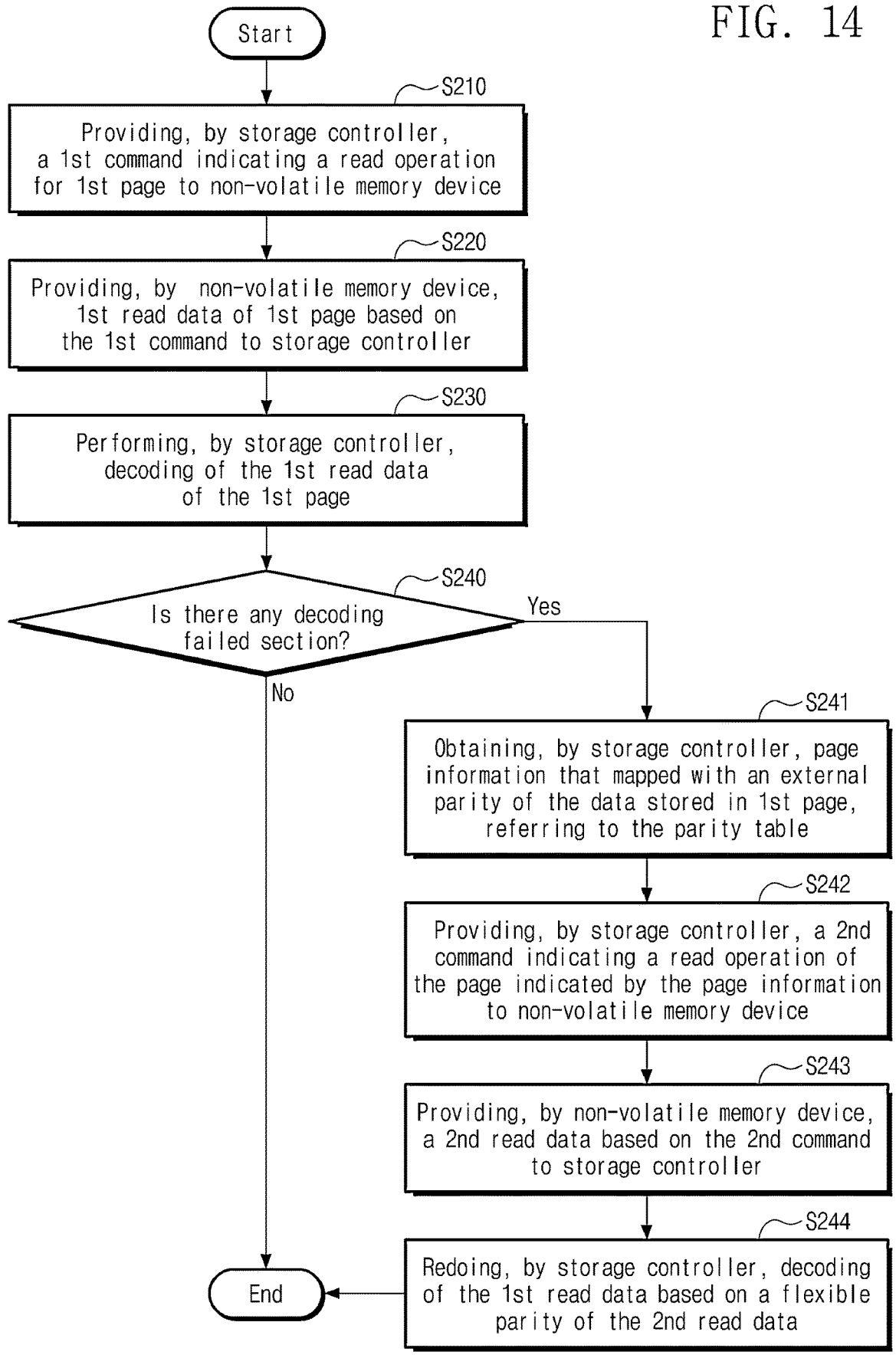
FIG. 14 is a flowchart describing a decoding operation of a storage device, according to some embodiments of the present disclosure.

FIG. 14 is a flowchart describing a decoding operation of a storage device, according to some embodiments of the present disclosure. A decoding operation of a storage device will be described with reference to FIG. 14. The storage device may include a storage controller and a non-volatile memory device. The storage controller and the non-volatile memory device may respectively correspond to the storage controller 110 and the non-volatile memory device 120 of FIG. 4.

In operation S210, the storage controller of the storage device may provide the non-volatile memory device with a first command indicating the read operation of a first page.

In operation S220, the non-volatile memory device of the storage device may provide the storage controller with first read data of the first page, based on the first command.

In operation S230, the storage controller of the storage device may decode the first read data of the first page.

In operation S240, the storage controller of the storage device may determine whether decoding of at least a portion of the first read data fails. When it is determined that decoding of at least a portion of the first read data fails, the procedure may proceed to operation S241. When it is determined that a decoding failure is absent, that is, the decoding of the first read data succeeds, the procedure may end.

In operation S241, the storage controller of the storage device may obtain page information mapped to an outside parity of first write data stored at the first page by referring to a parity table.

In operation S242, the storage controller of the storage device may provide the non-volatile memory device with a second command indicating the read operation of a second page indicated by the page information.

In operation S243, the non-volatile memory device of the storage device may provide the storage controller with second read data of the second page, based on the second command.

In operation S244, the storage controller of the storage device may again perform decoding for the first read data based on a flexible parity of the second read data.

In some embodiments, operation S244 may include generating a second inside parity based on second write data, calculating a first outside parity of first write data based on a flexible parity and a second inside parity, generating outside sub-parities based on pieces of section data succeeding in decoding from among pieces of section data of the first read data, calculating an outside sub-parity for section data failing in decoding from among the pieces of section data of the first read data based on the outside sub-parities and the first outside parity, and again performing decoding for the section data failing in decoding based on the calculated outside sub-parity.

Figure 15:
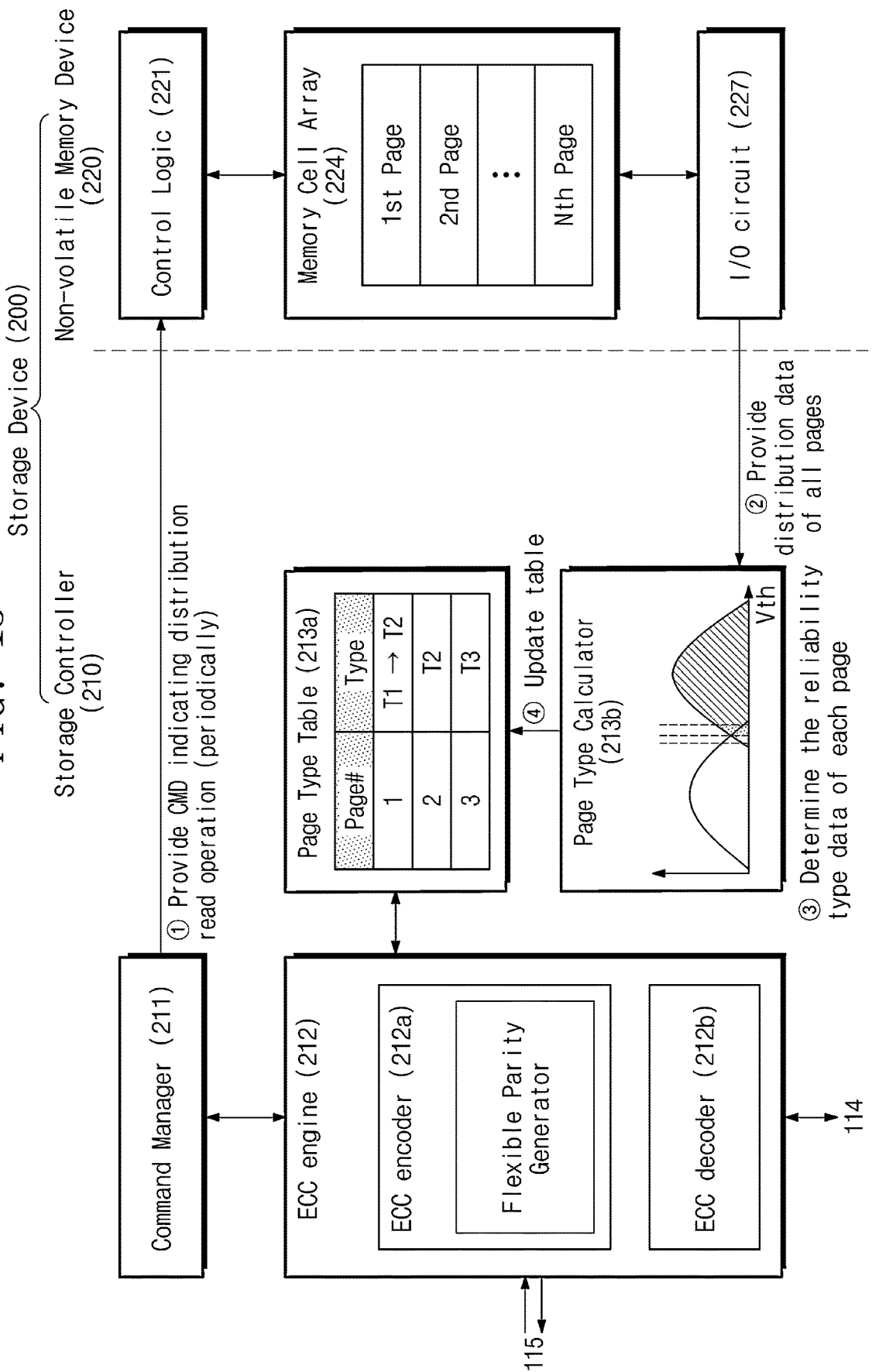
FIG. 15 is a diagram describing how to update a page type table, according to some embodiments of the present disclosure.

FIG. 15 is a diagram describing how to update a page type table 213a, according to some embodiments of the present disclosure. Embodiments in which a storage device 200 updates the page type table 213a will be described with reference to FIG. 15.

The description is given above as a plurality of pages of a non-volatile memory device and a plurality of reliability type information respectively corresponding to the plurality of pages are stored in advance in the page type table 113 of FIG. 4. However, as will be described later, according to some embodiments, the storage device 200 may update the page type table 213a.

The storage device 200 may include a storage controller 210 and a non-volatile memory device 220. The storage controller 210 may include a command manager 211, an ECC engine 212, the page type table 213a, and a page type calculator 213b. The command manager 211, the ECC engine 212, and the page type table 213a may respectively correspond to the command manager 111, the ECC engine 112, and the page type table 113 of FIG. 4. The non-volatile memory device 220 may include control logic 221, a memory cell array 224, and an I/O circuit 227. The control logic 221, the memory cell array 224, and the I/O circuit 227 respectively correspond to the control logic 121, the memory cell array 124, and the I/O circuit 127 of FIG. 3. For convenience, the description that is the same as or similar to the description given above will be omitted here to avoid redundancy and in the interest of brevity.

The command manager 211 may manage a distribution read command. The non-volatile memory device 220 may perform the distribution read operation on each of a plurality of pages of the memory cell array 224, based on the distribution read command. The distribution read operation may refer to an operation of reading a threshold voltage distribution of memory cells included in each of the plurality of pages.

The non-volatile memory device 220 may provide distribution data to the storage controller 210 based on the distribution read operation. The distribution data may include a threshold voltage distribution of each of the plurality of pages. For example, a threshold voltage distribution of a page may be the same as that of the graph of FIG. 9.

The page type calculator 213b may obtain the distribution data for each page from the non-volatile memory device 220. The page type calculator 213b may determine reliability type information of each of the plurality of pages based on the distribution data.

In some embodiments, the page type calculator 213b may calculate the reliability of each page. The reliability of each page may be calculated by the manner described with reference to FIG. 9. The page type calculator 213b may determine reliability type information based on a reliable zone, in which the reliability of each page is included, from among a plurality of reliable zones.

A plurality of reliable levels may include first to third reliable levels, and a reliable level may decrease in order of the first to third reliable levels. In this case, the reliability type information of a page whose reliability corresponds to the first reliable level may information indicating a first type T1 (may correspond to the bad state). The reliability type information of a page whose reliability corresponds to the second reliable level may be information indicating a second type T2 (may correspond to the normal state). The reliability type information of a page whose reliability corresponds to the third reliable level may be information indicating a third type T3 (may correspond to the good state). However, the present disclosure is not limited thereto. For example, the number of reliable levels may be 2 or less or 4 or more.

The page type calculator 213b may update the page type table 213a, based on determining the reliability type information of each of the plurality of pages.

For example, before the page type table 213a is updated, the page type table 213a may be in a state in storing the reliability type information of the first page corresponding to the first type T1. Afterwards, based on that the page type calculator 213b determines that the reliability type information of the first page corresponds to the second type T2, the page type calculator 213b may update reliability type information of a second page so as to be set to the second type T2.

Below, according to some embodiments of the present disclosure, a method in which the storage device 200 updates the page type table 213a will be described in greater detail.

In a first operation ①, the command manager 211 may provide the non-volatile memory device 220 with the distribution read command indicating the distribution read operation.

In some embodiments, the command manager 211 may provide periodically the distribution read command to the non-volatile memory device 120. For example, the command manager 211 may provide periodically the distribution read command based on the number of P/E cycles. The P/E cycle may indicate a series of events that data are programmed in memory cells, the memory cells are erased, and data are again programmed in the erased memory cells. That is, when the number of P/E cycles is more than or equal to the target number of times, the command manager 211 may provide the distribution read command to the non-volatile memory device 220.

In a second operation ②, the non-volatile memory device 220 may provide the storage controller 210 with distribution data indicating threshold voltage distributions of the plurality of pages.

In a third operation ③, the page type calculator 213b may determine reliability type information of each of the plurality of pages based on the distribution data.

In a fourth operation ④, the page type calculator 213b may update the page type calculator 213b based on the determined reliability type information.

However, the present disclosure is not limited thereto. The non-volatile memory device 220 may perform the distribution read operation to generate distribution data of a plurality of memory chips, a plurality of memory blocks, or a plurality of word lines. The page type calculator 213b may be referred to as a "memory chip type calculator", a "memory block type calculator", or a "word line type calculator", depending on a unit of distribution data. Also, the page type table 213a may be referred to as a "memory chip type table", a "memory block type table", or a "word line type table", depending on a unit of distribution data.

For example, the non-volatile memory device 220 may perform the distribution read operation for each memory block and may provide distribution data for respective memory blocks to the storage controller 210. The memory type calculator may determine reliability type information of each of the plurality of memory blocks based on the distribution data of each of the plurality of memory blocks. The memory type calculator may update a memory type table based on the determined reliability type information.

According to some embodiments of the present disclosure, storage devices configured to generate a parity based on reliability and operating methods thereof are provided.

Also, as a parity for error correction may be differently generated based on the reliability of a page or memory block where data are to be stored, an error correction of data stored in a page or memory block whose reliability is low may be improved or guaranteed. Accordingly, storage devices are provided whose error correction capability is improved.

While the present disclosure has been described with reference to some examples of embodiments of the inventive concepts thereof, it will be apparent to those of ordinary skill in the art that various changes and modifications may be made thereto without departing from the scope of the present disclosure as set forth in the following claims.

What is claimed is:

1. An operating method of a storage device which includes a page type table, a parity table, and a non-volatile memory device, the method comprising:
receiving a write request of first data from a host device;
generating, based on the first data, a first inside parity and a first outside parity;
storing the first outside parity in the parity table;
obtaining first reliability type information of a first page for storing the first data by referring to the page type table;
generating a first flexible parity based on the first inside parity and the first reliability type information;
generating first encoding data based on the first data and the first flexible parity; and
storing the first encoding data in the non-volatile memory device.

2. The method of claim 1, further comprising:
receiving a write request of second data from the host device;
generating a second inside parity and a second outside parity based on the second data;
storing the second outside parity in the parity table;
obtaining second reliability type information of a second page for storing the second data, by referring to the page type table;
generating a second flexible parity, based on the second inside parity and the second reliability type information;
generating second encoding data, based on the second data and the second flexible parity; and
storing the second encoding data in the non-volatile memory device.

3. The method of claim 2, wherein the first reliability type information indicates a first reliable level,
wherein the second reliability type information indicates a second reliable level higher than the first reliable level, and
wherein the generating of the second flexible parity based on the second inside parity and the second reliability type information includes:
obtaining the first outside parity by referring to the parity table; and
generating the second flexible parity, based on a first combination operation of the first outside parity and the second inside parity.

4. The method of claim 3, wherein the first combination operation includes an XOR operation.

5. The method of claim 3, wherein the generating of the second flexible parity based on the second inside parity and the second reliability type information further includes:
storing mapping information of the first outside parity and the second page in the parity table.

6. The method of claim 3, further comprising:
providing the non-volatile memory device with a first command indicating a read operation of the first page;
receiving first read data of the first page from the non-volatile memory device;
determining that decoding for at least a portion of the first read data fails;
in response to determining that decoding for at least a portion of the first read data fails, obtaining page information indicating the second page mapped to the first outside parity, by referring to the parity table;
providing the non-volatile memory device with a second command indicating a read operation of the second page, based on the page information;
receiving second read data of the second page from the non-volatile memory device; and
again performing the decoding of the first read data, based on the second flexible parity of the second read data.

7. The method of claim 6, wherein the again performing of the decoding of the first read data based on the second flexible parity of the second read data includes:
generating the second inside parity, based on the second read data;
calculating the first outside parity, based on the second flexible parity and the second inside parity; and
again performing decoding of the first read data, based on the first outside parity.

8. The method of claim 2, further comprising:
receiving third data from the host device;
generating a third inside parity and a third outside parity, based on the third data;

storing the third outside parity in the parity table;
obtaining third reliability type information of a third page for storing the third data, by referring to the page type table;
generating a third flexible parity, based on the third inside parity and the third reliability type information;
generating third encoding data, based on the third data and the third flexible parity; and
storing the third encoding data in the non-volatile memory device.

9. The method of claim 8, wherein the first reliability type information indicates a first reliable level,
wherein the second reliability type information indicates a second reliable level higher than the first reliable level,
wherein the third reliability type information indicates a third reliable level higher than the second reliable level, and
wherein the generating of the third flexible parity based on the third inside parity and the third reliability type information includes:
obtaining the first outside parity and the second outside parity from the parity table; and
generating the third flexible parity, based on a fourth combination operation of the first outside parity, the second outside parity, and the third inside parity.

10. The method of claim 1, wherein the page type table includes a plurality of reliability type information respectively corresponding to a plurality of pages of the non-volatile memory device, and
wherein the first reliability type information indicates a reliable zone including a first reliability calculated based on a threshold voltage distribution of memory cells of the first page.

11. The method of claim 10, wherein a number of first memory cells indicates a number of memory cells each determined as an error bit from among the memory cells, based on a first read voltage level,
wherein a number of second memory cells indicates a number of memory cells each determined as a correct bit from among the memory cells, based on the first read voltage level,
wherein a number of third memory cells indicates a number of memory cells each determined as an error bit from among the memory cells, based on a second read voltage level,
wherein a number of fourth memory cells indicates a number of memory cells each determined as a correct bit from among the memory cells, based on the second read voltage level, and
wherein the first reliability is calculated based on at least one of ratios of the number of the first memory cells, the number of the second memory cells, the number of the third memory cells, and the number of the fourth memory cells.

12. The method of claim 10, wherein before obtaining the first reliability type information of the first page for storing the first data by referring to the page type table, the storage device is configured to:
obtain the threshold voltage distribution of the first page from the non-volatile memory device;
calculate the first reliability based on the threshold voltage distribution;
determine that the first page corresponds to the first reliability type information, based on the first reliability; and
update the page type table based on determining that the first page corresponds to the first reliability type information.

13. The method of claim 1, wherein the first data are a plurality of sectors, and
wherein the generating of the first inside parity and the first outside parity based on the first data includes:
generating a plurality of inside sub-parities respectively corresponding to the plurality of sectors, by using a first ECC technique;
generating a plurality of outside sub-parities respectively corresponding to the plurality of sectors, by using a second ECC technique;
generating the first inside parity, based on a second combination operation of the plurality of inside sub-parities; and
generating the first outside parity, based on a third combination operation of the plurality of outside sub-parities.

14. A storage device comprising:
a non-volatile memory device including a plurality of pages;
a command manager configured to receive a write request of first data from a host device and configured to determine a first page for storing the first data from among the plurality of pages;
a page type table configured to store a plurality of reliability type information respectively corresponding to the plurality of pages;
a parity table; and
an ECC engine,
wherein the ECC engine is configured to:
generate, based on the first data, a first inside parity and a first outside parity;
store the first outside parity in the parity table;
obtain first reliability type information of the first page, by referring to the page type table;
generate a first flexible parity based on the first inside parity and the first reliability type information;
generate first encoding data based on the first data and the first flexible parity; and
store the first encoding data in the non-volatile memory device.

15. The storage device of claim 14, wherein the command manager is further configured to:
receive a write request of second data from the host device; and
determine a second page for storing the second data from among the plurality of pages, and
wherein the ECC engine is further configured to:
generate a second inside parity and a second outside parity based on the second data;
store the second outside parity in the parity table;
obtain second reliability type information of the second page, by referring to the page type table;
generate a second flexible parity based on the second inside parity and the second reliability type information;
generate second encoding data based on the second data and the second flexible parity; and
store the second encoding data in the non-volatile memory device.

16. The storage device of claim 15, wherein the first reliability type information indicates a first reliable level,
wherein the second reliability type information indicates a second reliable level that is higher than the first reliable level, and wherein the ECC engine is further configured to:
obtain the first outside parity in the parity the table; and
generate the second flexible parity, based on a fifth combination operation of the second inside parity and the first outside parity.

17. The storage device of claim 16, wherein the fifth combination operation includes an XOR operation.

18. The storage device of claim 15, wherein the command manager is further configured to:
receive a write request of third data from the host device; and
determine a third page for storing the third data from among the plurality of pages, and
wherein the ECC engine is further configured to:
generate a third inside parity and a third outside parity, based on the third data;
store the third outside parity in the parity table;
obtain third reliability type information of the third page, by referring to the page type table;
generate a third flexible parity, based on the third inside parity and the third reliability type information;
generate third encoding data, based on the third data and the third flexible parity; and
store the third encoding data in the non-volatile memory device.

19. The storage device of claim 18, wherein the first reliability type information indicates a first reliable level,
wherein the second reliability type information indicates a second reliable level that is higher than the first reliable level,
wherein the third reliability type information indicates a third reliable level that is higher than the second reliable level, and
wherein the ECC engine is further configured to:
obtain the first outside parity and the second outside parity from the parity table; and
generate the third flexible parity, based on a sixth combination operation of the second inside parity, the first outside parity, and the second outside parity.

20. An operating method of a storage device which includes a memory block type table, a parity table, and a non-volatile memory device, the operating method comprising:
receiving a write request of first data from a host device;
generating, based on the first data, a first inside parity and a first outside parity;
storing the first outside parity in the parity table;
obtaining first reliability type information of a first memory block for storing the first data, by referring to the memory block type table;
generating a first flexible parity based on the first inside parity and the first reliability type information;
generating first encoding data based on the first data and the first flexible parity; and
storing the first encoding data in the non-volatile memory device.

* * * * *